US006555908B1

(12) United States Patent
Eichelberger et al.

(10) Patent No.: US 6,555,908 B1
(45) Date of Patent: Apr. 29, 2003

(54) COMPLIANT, SOLDERABLE INPUT/OUTPUT BUMP STRUCTURES

(75) Inventors: Charles W. Eichelberger, Wakefield, MA (US); James E. Kohl, Reading, MA (US)

(73) Assignee: EPIC Technologies, Inc., Woburn, MA (US)

( * ) Notice: Subject to any disclaimer, the term of this patent is extended or adjusted under 35 U.S.C. 154(b) by 0 days.

(21) Appl. No.: 09/501,177

(22) Filed: Feb. 10, 2000

(51) Int. Cl.$^7$ ............................................... H01L 23/34
(52) U.S. Cl. ...................... 257/737; 257/778; 257/738; 257/723
(58) Field of Search ................................ 257/737, 738, 257/778, 723

(56) References Cited

U.S. PATENT DOCUMENTS 5,841,193 A    11/1998  Eichelberger et al. ...... 257/723
6,277,669 B1 *  8/2001  Kung et al. ................. 438/106

OTHER PUBLICATIONS

"EPIC CSP Assembly and Reliability Methods," James E. Kohl et al., originally published in the Proceedings of CS198, Santa Clara, California, May 1998.

"Low Cost Chip Scale Packaging and Interconnect Technology," James E. Kohl, et al., originally published in the Proceedings of the Surface Mount International Conference, San Jose, California, Sep. 1997.

* cited by examiner

Primary Examiner—Roy Potter
(74) Attorney, Agent, or Firm—Kevin P. Radigan, Esq.; Heslin Rothenberg Farley & Mesiti P.C.

(57) ABSTRACT

Structures and methods are provided for electrically interconnecting and absorbing stress between a first electrical structure and a second electrical structure. In one embodiment, non-conductive compliant bumps are disposed on at least one of the structures and a metal layer is provided over a surface of the non-conductive compliant bumps. The metal layer facilitates electrical coupling of the metal on the surfaces of the compliant bumps with multiple contact pads of the structure supporting the bumps. The non-conductive compliant bumps can be fabricated of a low modulus material which has a high ultimate elongation property (LMHE dielectric). The LMHE dielectric can have a Young's modulus of less than 50,000 psi and an ultimate elongation property of at least twenty percent. In an alternate embodiment, at least one mushroom-shaped conductive bump is disposed above a compliant dielectric layer on one of the first electrical structure or the second electrical structure. The mushroom-shaped conductive bumps are employed to electrically interconnect the first and second electrical structures. The compliant dielectric layer can be a LMHE dielectric.

24 Claims, 32 Drawing Sheets

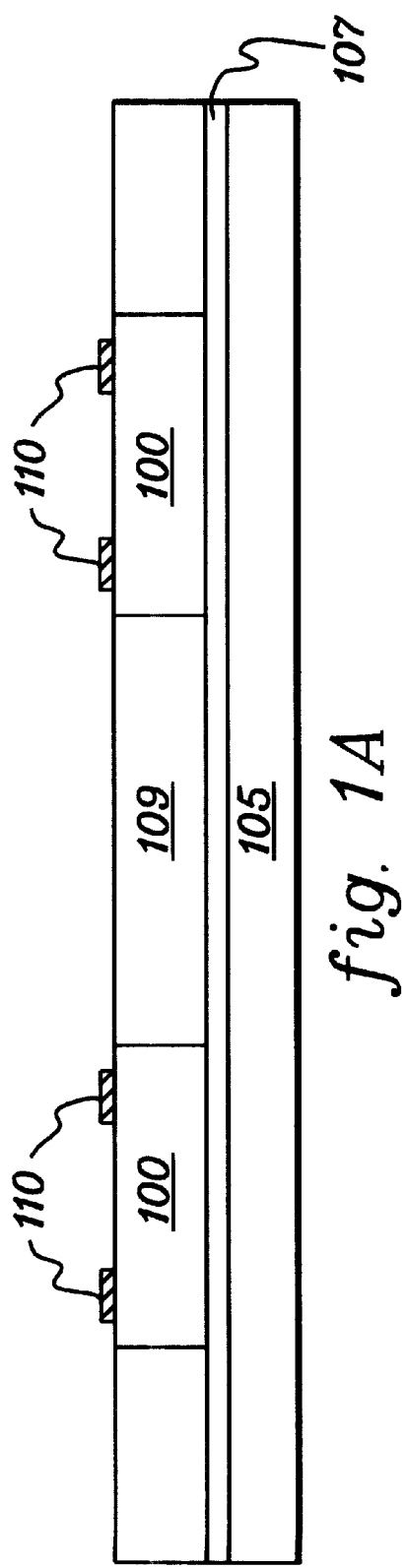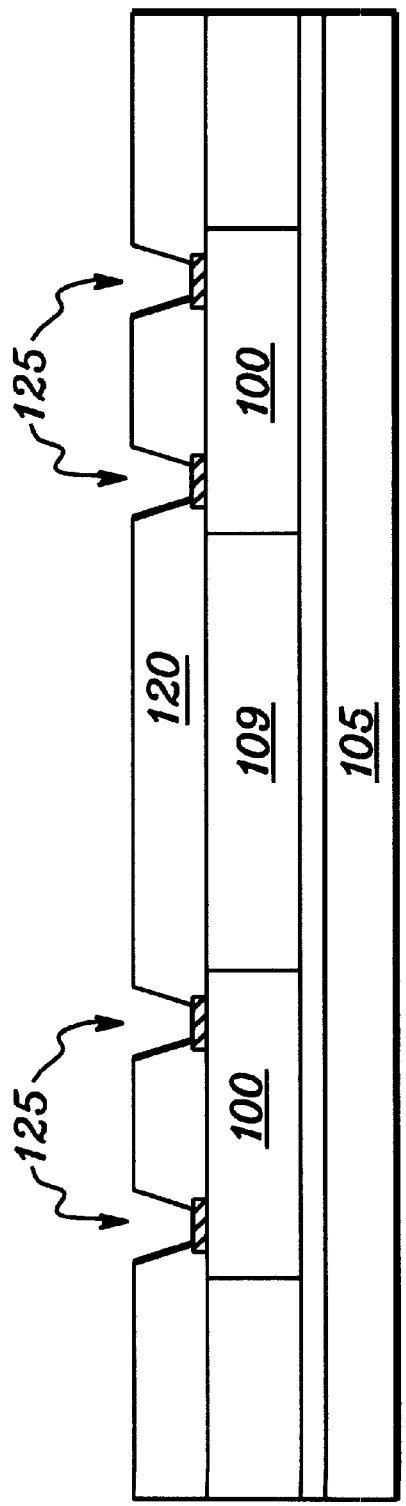
fig. 1A
fig. 1B

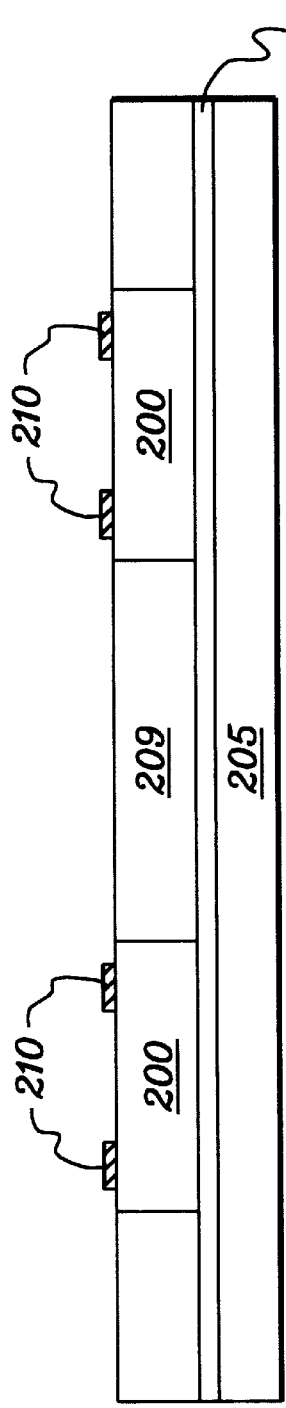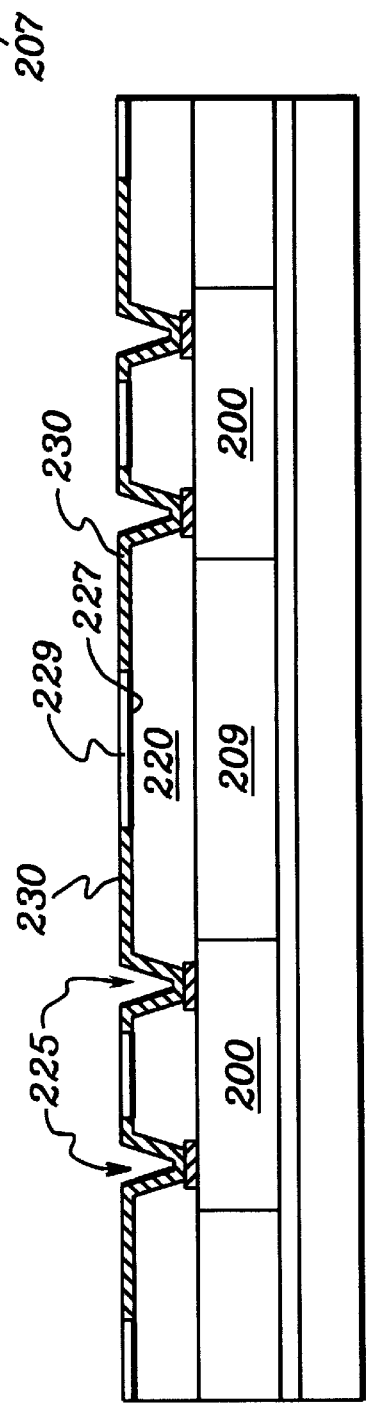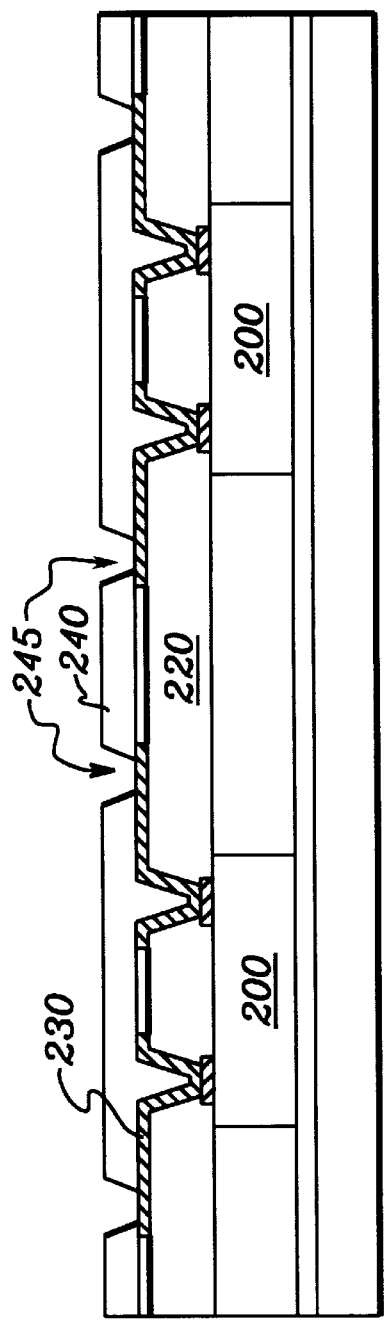

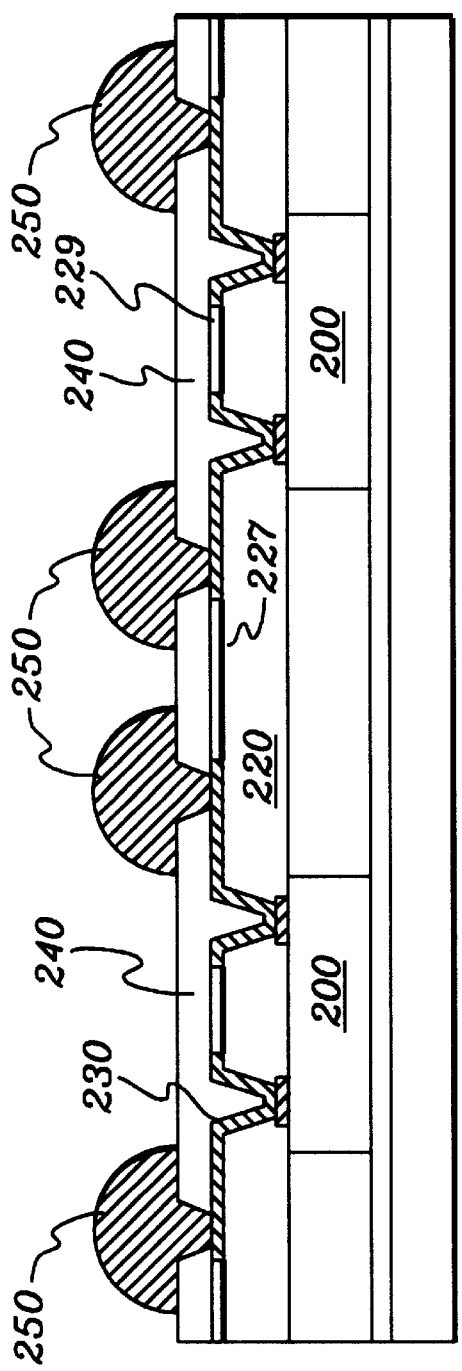
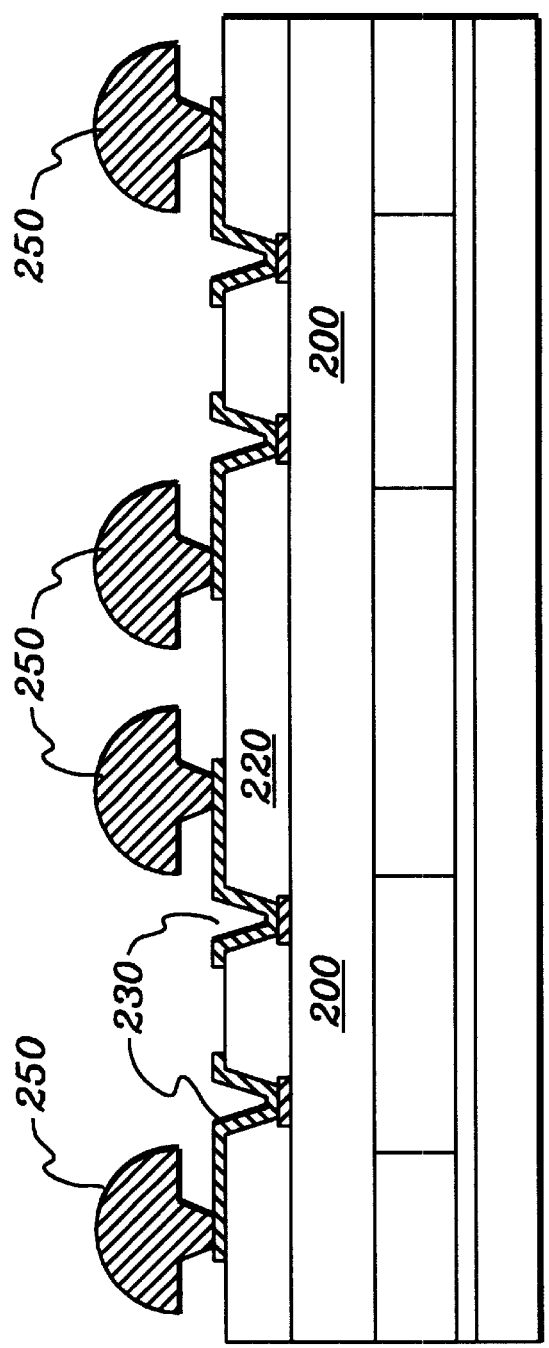

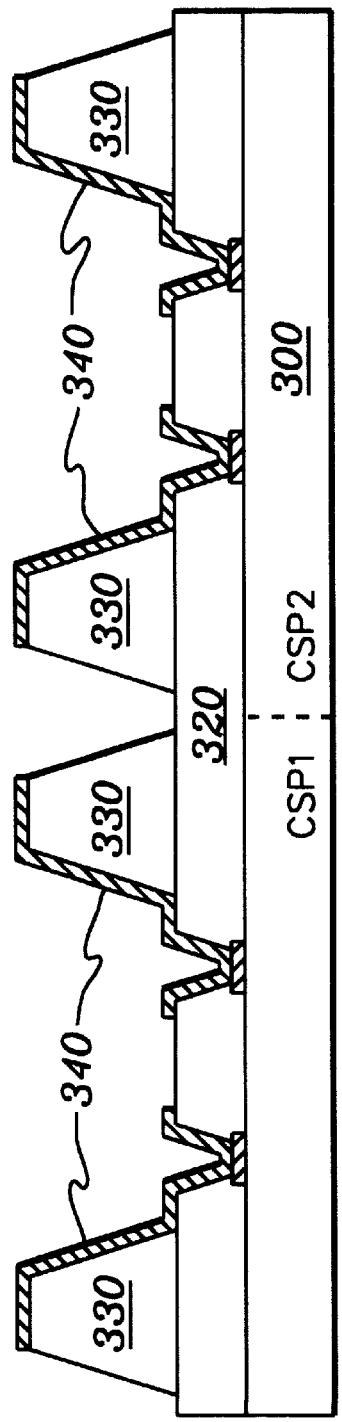
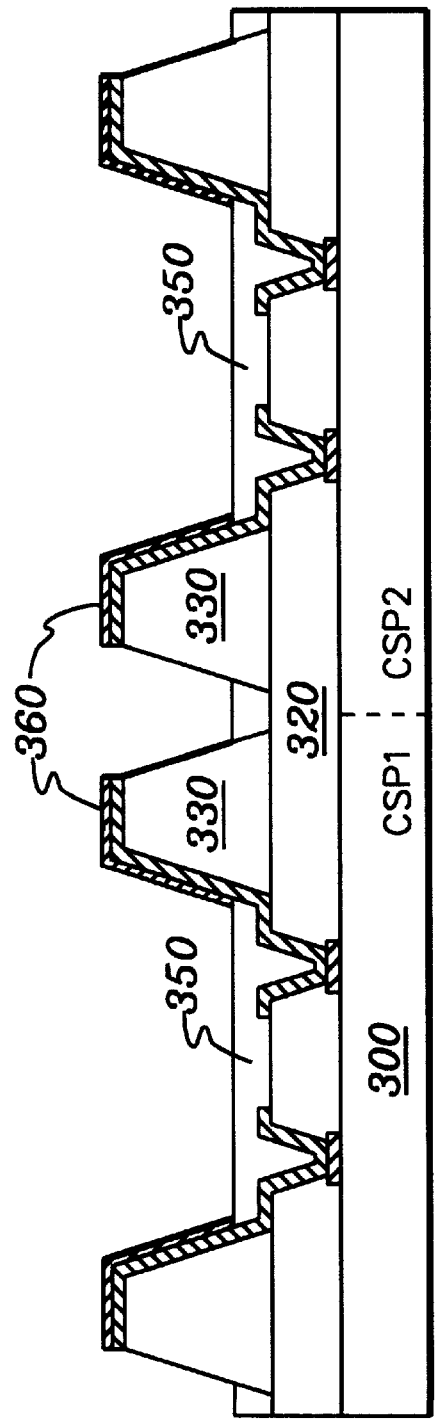
fig. 3C
fig. 3D

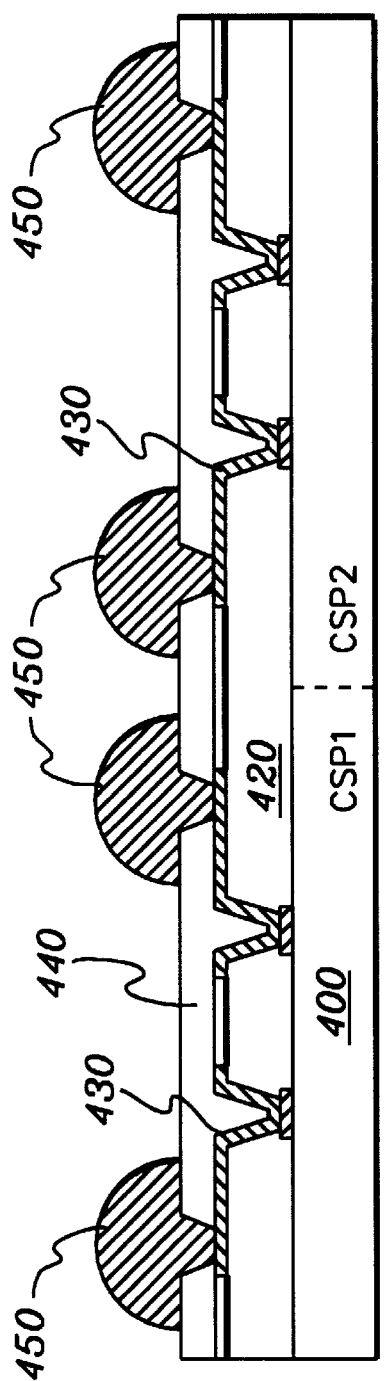
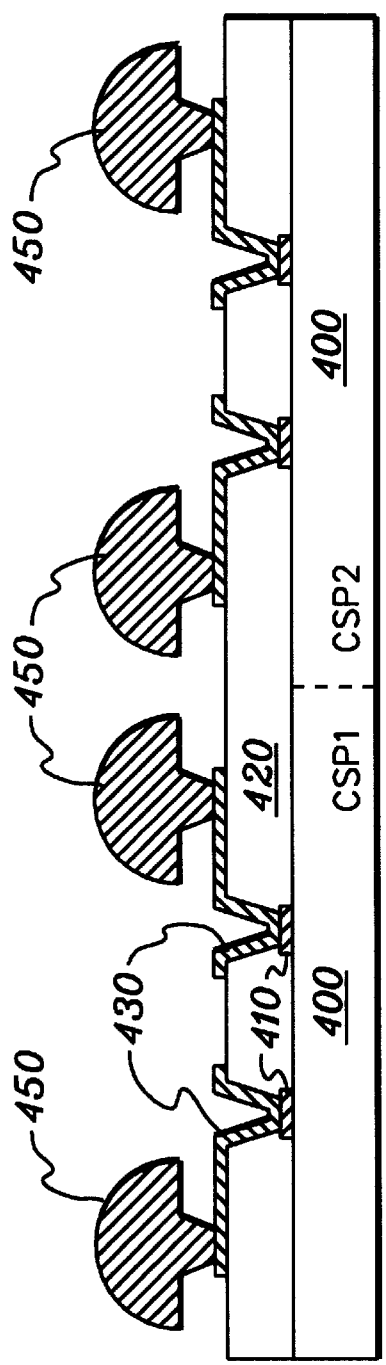
fig. 4D
fig. 4E

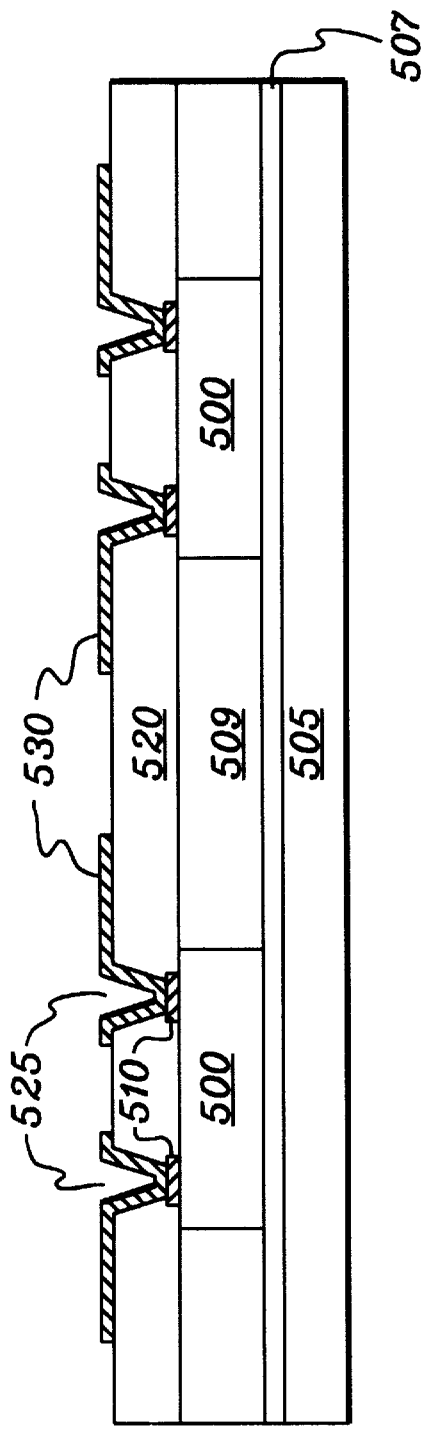
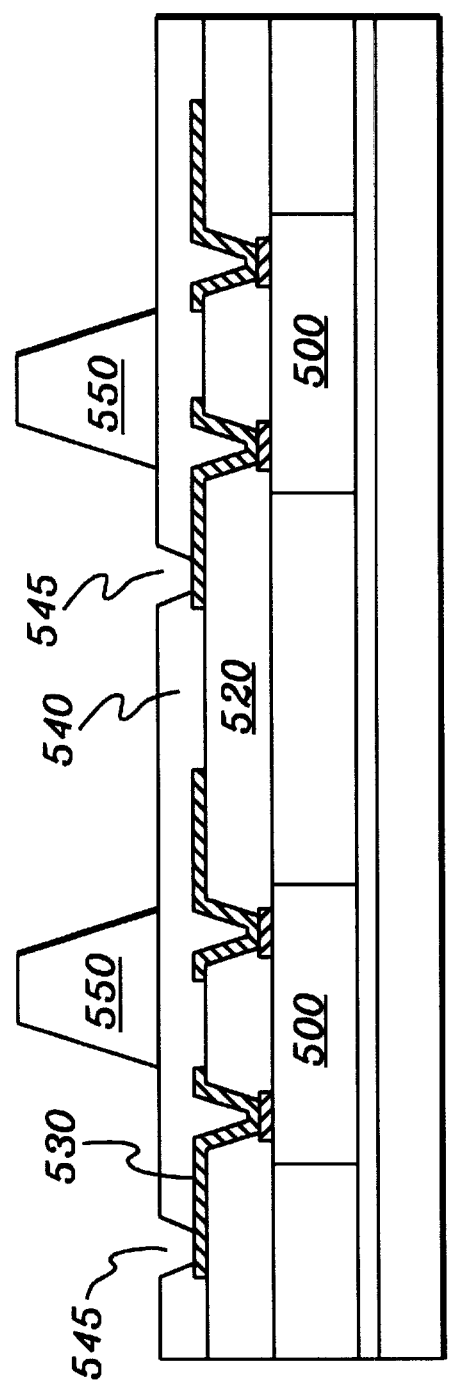

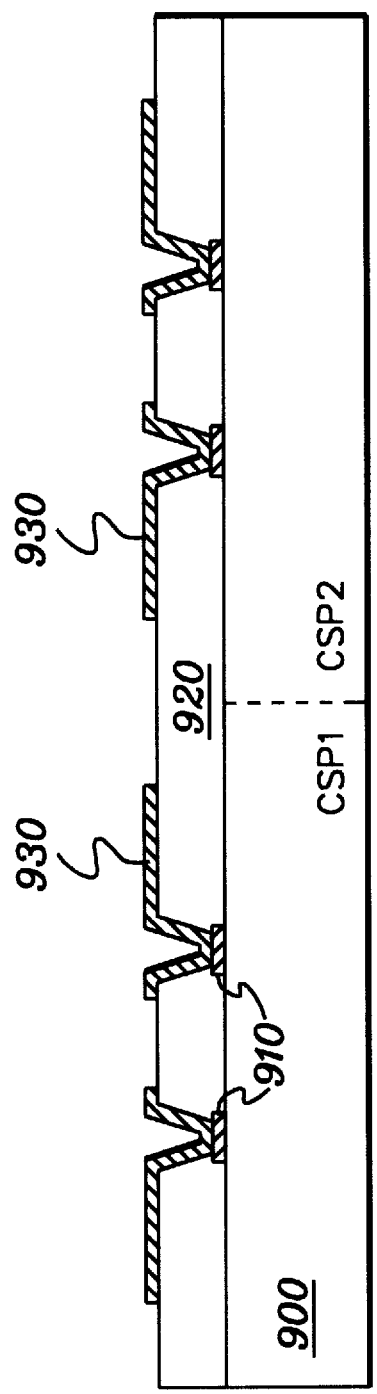
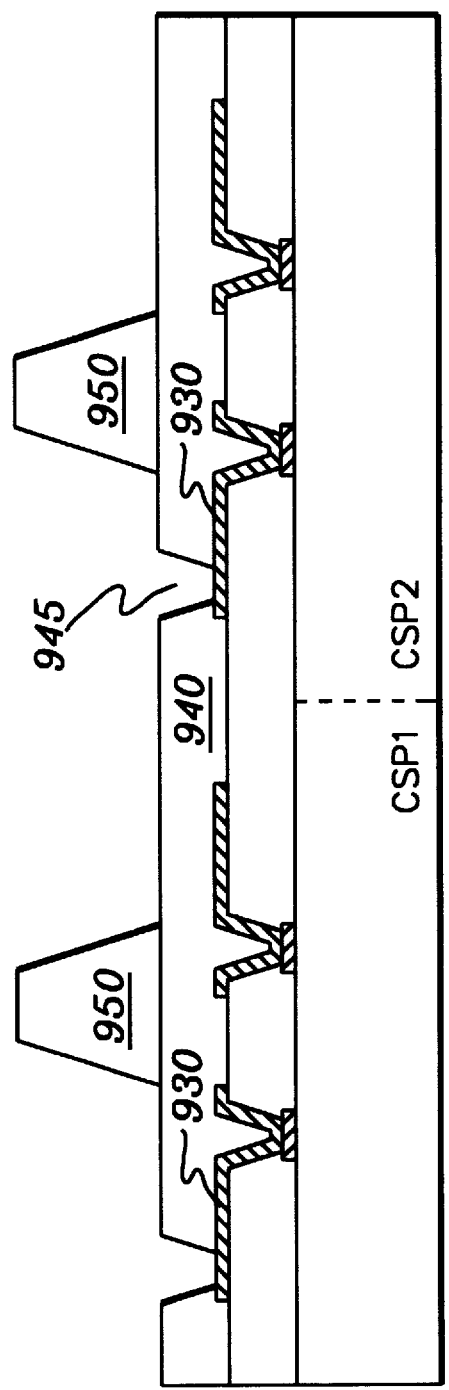
fig. 9A
fig. 9B

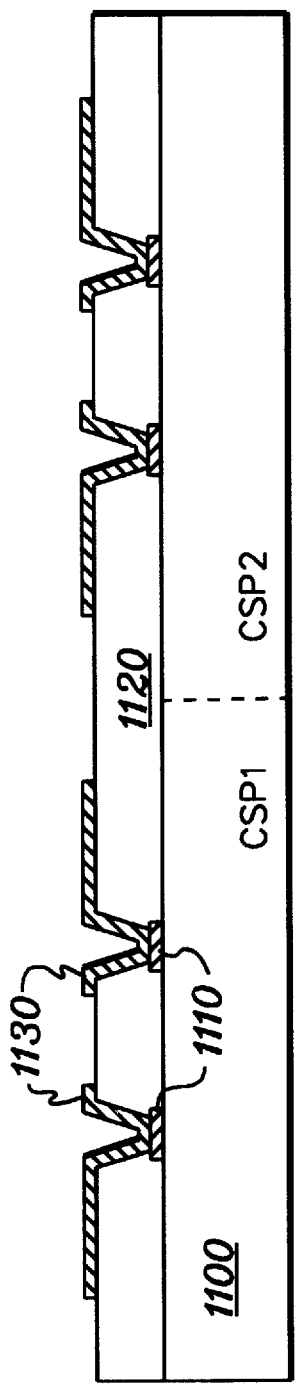
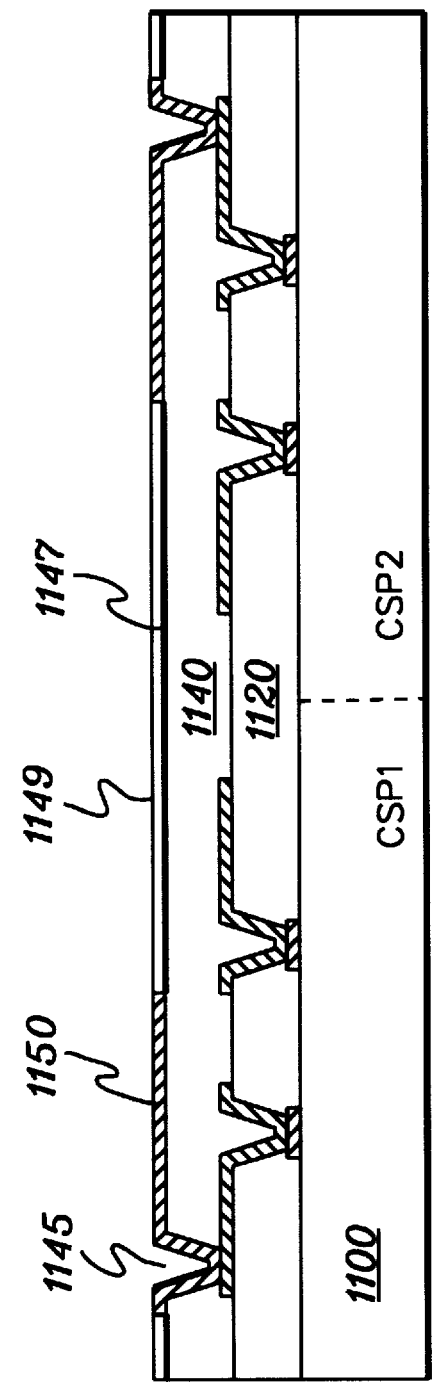
fig. 11A
fig. 11B

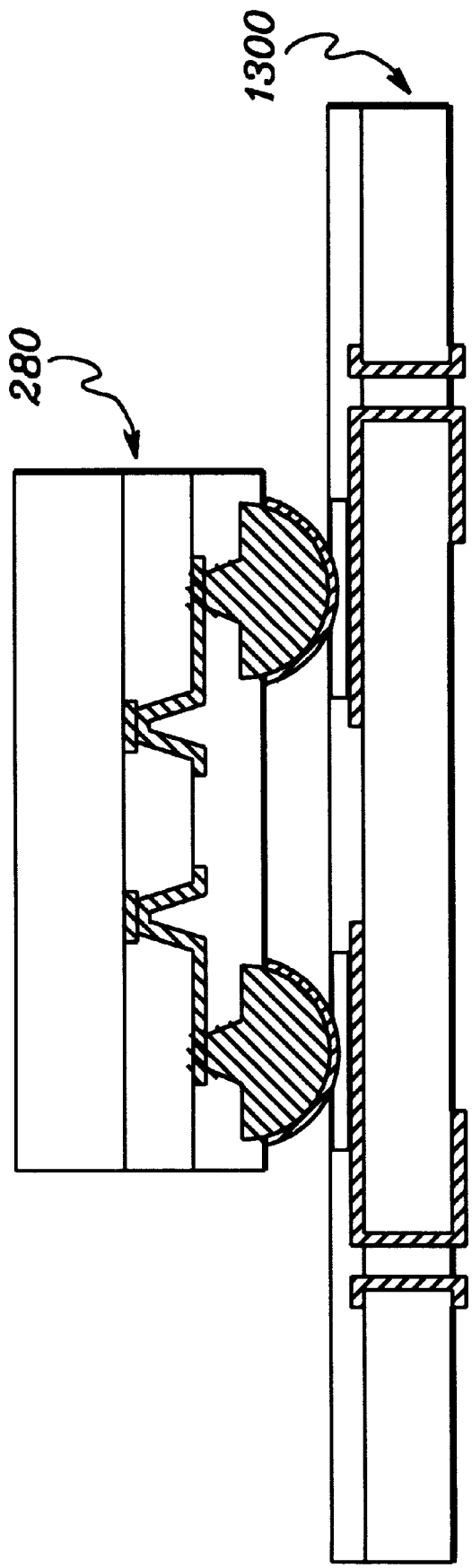

COMPLIANT, SOLDERABLE INPUT/OUTPUT BUMP STRUCTURES

CROSS-REFERENCE TO RELATED APPLICATIONS

This application contains subject matter which is related to the subject matter of the following applications, each of which is assigned to the same assignee as this application and each of which is hereby incorporated herein by reference in its entirety:

"Electroless Metal Connection Structures and Methods," Eichelberger et al., Ser. No. 09/501,200, co-filed herewith;

"Structure and Method for Temporarily Holding Integrated Circuit Chips in Accurate Alignment," Ser. No. 09/501,176, co-filed herewith; and "Integrated Circuit Structures and Methods Employing a Low Modulus High Elongation Photodielectric," Ser. No. 09/502,078, co-filed herewith.

TECHNICAL FIELD

The present invention relates in general to packaging integrated circuits, and more particularly, to structures and methods for electrically interconnecting and absorbing stress between a first electrical structure and a second electrical structure, wherein the first and second structures may have different coefficients of thermal expansion.

BACKGROUND OF THE INVENTION

The problem addressed herein relates to stresses on the input/output (I/O) bumps of Flip Chips, Chip Scale Packages, and interposers for Ball Grid Array (BGA) packages. Specifically, these bumps connect from the pads on, for example, a Flip Chip or Chip Scale Package to a printed circuit board by soldering to pads on the printed circuit board. The printed circuit board is usually an FR4-type board which has an expansion coefficient of 10 to 20 ppm per degree C depending on the amount of copper wiring employed and other board configuration parameters. In comparison, a silicon integrated circuit (IC) chip has an expansion coefficient of 2–4 ppm per degree C. As a result of this mismatch, thermal stresses can be set up which tend to fatigue the bump or the material surrounding the bump. After several thermal cycles the solder or adjacent material can fail resulting in an open circuit.

The earliest known process of the type described above is the IBM C4 process in which small solder balls are built up directly on the pads of an IC chip. The chip is then inverted and soldered to pads on a circuit board. This process works well when the substrate is well matched to the silicon IC. Such substrates as silicon or alumina have expansion coefficients of 2 to 6 ppm. When this process is done on an FR4 substrate using large chips (1 to 2 cm) less than 100 thermal cycles can be achieved before failure. To minimize this effect, a process is often used where an epoxy material is caused to flow under the chip to bond the chip to the substrate. This distributes the stresses and increases the number of thermal cycles to failure by an order of magnitude. Two problems exist with this process. First, this so called under-fill process requires time consuming steps of deposition and vacuum flow followed by curing. Second, if a chip is bad it cannot be removed once the under-fill has been applied and cured.

Another alternative is to use solder balls which are large in diameter or height so that the differential expansion is amortized over the length of the solder and the 1% strain limit is not exceeded. (It has been found that if solder strain is kept below 1% during temperature cycling then the number of thermal cycles that the solder can endure without fatigue failure is in the 100 to 1000 cycle range.) The problem in this case is that large solder balls take up a large amount of space which is not usually available on the surface of an IC chip. Various techniques have been developed for screen printing large solder balls or columns but these have the same problem that the solder foot print is large and limits the number of I/O available for a given chip size. In addition, when the part is removed usually some solder remains on the circuit board and some solder remains on the part. This adds a requirement for completely cleaning the solder from the circuit board pads before replacing the part.

Another approach is provided by Tessera Inc. of San Jose, Calif., in which a Kapton "flex circuit" layer is placed over a compliant layer on the IC chip. The compliant layer decouples the chip from the Kapton "flex circuit" layer. The Kapton "flex circuit" connects to the circuit board but does not communicate the expansion differential back to the IC chip since the compliant layer is interspersed between the IC chip and the Kapton "flex circuit". In the Tessera approach, wire or ribbon bonding is used to make connection from the edge of the Kapton circuit layer to the bond pads of the chip. This precludes wiring channels in the area above the bond pads of an IC and thereby limits the number of bond pads which can be accommodated. The approach is expensive because it is not well integrated. It really consists of several components: the Kapton circuit layer, the wire bond or ribbon interconnect, the compliant material and an encapsulant to hold the whole system together. This leads to expensive serial processing steps to connect up the package. (However, the approach does address the problem of thermal mismatch and Tessera chip scale packages can be attached to FR4 circuit boards without under-fill.)

To address the deficiencies of the above processes, presented herein are certain novel structures and methods of fabrication which maintain the strain on the solder or interconnection bumps between a first and second electrical structure to a level lower than the desired 1% level.

DISCLOSURE OF THE INVENTION

In view of the above, one object of this invention is to provide I/O bumps on, for example, a chip scale package or multichip module package with sufficient compliance that the packages can be readily mounted on a printed circuit board, such as a conventional printed circuit board, without requiring the use of under-fill between the package and the board.

Another object of this invention is to provide a chip scale package or multichip module package with the attributes of flip chip (small bumps, high I/O capability, and low inductance, high density interconnection), without requiring under-fill when mounting the package to a printed circuit board.

Still another object of the present invention is to provide I/O bumps on chip scale and multichip module packages which allow removal of the packages from a printed circuit board without leaving large differential solder residue.

A further object of the present invention is to provide an I/O bump for chip scale and multichip module packages which has sufficient compliance that temporary electrical contact to a circuit board can be made directly without use of an interposer or sockets.

Briefly summarized, the present invention comprises in one aspect a circuit structure which includes a support surface having at least one contact pad disposed thereon. A dielectric layer is disposed over the support surface and has at least one via opening exposing the at least one contact pad. At least one non-conductive compliant bump is disposed above the dielectric layer, and at least one metal layer is provided which includes metal over a surface of the at least one non-conductive compliant bump. The at least one metal layer facilitates electrical coupling of the metal over the surface of the at least one non-conductive compliant bump with the at least one contact pad on the support surface.

In another aspect, a circuit structure is provided which includes a support surface having at least one contact pad disposed thereon. A dielectric layer is disposed over the support surface and includes at least one via opening therein exposing the at least one contact pad. A metal layer is disposed over the dielectric layer and extends into the at least one via opening to electrically contact the at least one contact pad. The circuit structure further includes at least one mushroom-shaped conductive bump disposed above the dielectric layer and electrically coupling to the metal layer. Each mushroom-shaped conductive bump has a stem portion and a top portion, with the stem portion electrically coupling the top portion to the metal layer.

In yet another aspect, a method of fabricating a circuit structure is provided which includes: providing a support surface having at least one contact pad disposed thereon; disposing a dielectric layer over the support surface, and forming at least one via opening in the dielectric layer to expose the at least one contact pad; providing at least one non-conductive compliant bump over the dielectric layer; and forming at least one metal layer which includes metal over a surface of the at least one non-conductive compliant bump, and which facilitates electrical coupling of the metal over the surface of the at least one non-conductive compliant bump with the at least one contact pad of the support surface.

In a further aspect, provided herein is a method of fabricating a circuit structure which includes: providing a support surface having at least one contact pad formed thereon; disposing a dielectric layer above the support surface, and forming at least one via opening in the dielectric layer to expose the at least one contact pad; disposing a metal layer over the dielectric layer and extending into the at least one via opening to electrically contact the at least one contact pad; and providing at least one mushroom-shaped conductive bump above the dielectric layer and electrically coupled to the metal layer, wherein each mushroom-shaped conductive bump has a stem portion and a top portion, said stem portion electrically coupling said top portion to said metal layer.

To restate, provided herein are structures and methods which employ a compliant photo patternable polymer either as the core of an I/O bump or to provide compliance under a solid conductive bump. In either case, compliance is sufficient to absorb the expansion differential between, for example, a chip scale package and an FR4-type printed circuit board to which the package is solder mounted. The structures disclosed herein have the advantage of flip chip technology, but can be mounted directly on an FR4-type circuit board without the requirement for under-fill for reliability. Fabrication methods are disclosed for providing the structure directly on a wafer or for fabricating the structure in a panel of individual chips. Both single and multichip structures are disclosed. Also provided is a novel self-aligning solder mask in which the solder mask polymer is coated on the bump, and runs off the top of the bump leaving it exposed for subsequent plating of a solderable finish.

The structures and methods preferably employ a low elastic modulus and high ultimate elongation property material (LMHE dielectric). The disclosed material is photo patternable and can be patterned with a very short exposure time. Further, the material can be developed in thick sections with excellent resolution using simple dip tank development techniques as opposed to more complicated spray development techniques. The low modulus property essentially eliminates any stress on solder or other ball-type joints that interconnect, for example, packaged integrated circuit chips to a printed circuit board. The high elongation property allows the dielectric to stretch significantly without failure to the dielectric. Various structural configurations that make use of the LMHE dielectric material are described.

BRIEF DESCRIPTION OF THE DRAWINGS

The above-described objects, advantages and features of the present invention, as well as others, will be more readily understood from the following detailed description of certain preferred embodiments of the invention, when considered in conjunction with the accompanying drawings in which:

FIG. 1A is a cross-sectional elevational view of one embodiment of a panel of singulated integrated circuit (IC) chips surrounded by filler mounted on a substrate to employ a structure in accordance with the principles of the present invention;

FIG. 1B is a cross-sectional elevational view of the structure of FIG. 1A with a compliant dielectric layer disposed thereon and which has multiple via openings defined therein in accordance with the principles of the present invention;

FIG. 2A is a cross-sectional elevational view of one embodiment of a panel of singulated integrated circuit (IC) chips surrounded by filler mounted on a substrate to employ a structure in accordance with the principles of the present invention;

FIG. 2B is a cross-sectional elevational view of the structure of FIG. 2A showing a compliant dielectric sprayed and patterned with via holes, a seed metal layer applied thereto, electro-deposited resist applied and patterned, and a metal layer plated up as defined by the resist in accordance with the principles of the present invention;

FIG. 2C is a cross-sectional elevational view of the structure of FIG. 2B after application of a positive resist and patterning thereof with via holes exposing portions of the metal layer from which conductive bumps are to be grown in accordance with the principles of the present invention;

FIG. 2D is a cross-sectional elevational view of the structure of FIG. 2C after growing of solid metal bumps resulting in mushroom-shaped interconnect in accordance with the principles of the present invention;

FIG. 2E is a cross-sectional elevational view of the structure of FIG. 2D after the positive resist, electro-deposited resist, and seed metal layers have been removed in accordance with the principles of the present invention;

FIG. 3C is a cross-sectional elevational view of the structure of FIG. 3B showing completed compliant polymer bumps and patterned metallization thereon in accordance with the principles of the present invention;

FIG. 3D is a cross-sectional elevational view of the structure of FIG. 3C showing application of a self-patterning solder mask and formation of a solderable finish on exposed portions of the patterned metallization residing on the compliant polymer bumps in accordance with the principles of the present invention;

FIG. 4D is a cross-sectional elevational view of the structure of FIG. 4C after plating of solid conductive bumps from exposed portions of the metal layer in accordance with the principles of the present invention;

FIG. 4E is a cross-sectional elevational view of the structure of FIG. 4D after removal of the positive resist, electro-deposited resist, and seed metal layer disposed below the electro-deposited resist in accordance with the principles of the present invention;

FIG. 5A is a cross-sectional elevational view of one embodiment of panel of singulated integrated circuit (IC) chips surrounded by filler mounted on a substrate and having a dielectric layer disposed thereover and a first metal layer disposed on the dielectric layer in accordance with the principles of the present invention;

FIG. 5B is a cross-sectional elevational view of the structure of FIG. 5A after application of a second dielectric layer and patterning thereof with via holes, and after formation of compliant polymer bumps above the second dielectric layer in accordance with the principles of the present invention;

FIG. 7F in accordance with the principles of the present invention;

FIG. 9A is a cross-sectional elevational view of one embodiment of a wafer with two integrated circuit chips defined therein and dielectric applied to an upper surface thereof and provided with via openings to bond pads on the wafer, with patterned metallization thereon to electrically connect through the vias to the bond pads in accordance with the principles of the present invention;

FIG. 9B is a cross-sectional elevational view of the structure of FIG. 9A after spraying of a second dielectric layer and patterning thereof with via openings, to expose selected portions of the metal 1 layer and after formation of compliant polymer bumps in accordance with the principles of the present invention;

FIG. 11A is a cross-sectional elevational view of one embodiment of a wafer with two integrated circuit chips defined therein and a first dielectric layer disposed thereon patterned with via openings and a metal 1 layer provided above the first dielectric layer connected to exposed bond pads on the wafer in accordance with the principles of the present invention;

FIG. 11B is a cross-sectional elevational view of the structure of FIG. 11A showing application of a second dielectric layer and patterning thereof with via openings, formation of a seed metal layer above the second dielectric layer, electrodeposited resist applied and patterned, and formation of a metal 2 layer plated as defined by the resist in accordance with the principles of the present invention;

FIG. 13E is a cross-sectional elevational view of the structure of FIG. 13A and the CSP module of FIG. 2G electrically interconnected thereto in accordance with the principles of the present invention;

BEST MODE FOR CARRYING OUT THE INVENTION

As noted briefly above, disclosed herein are various dielectric and metal structures that can absorb differential stress between a first electrical structure and a second electrical structure which are bump interconnected, such as between a printed circuit board and an associated packaged or bumped integrated circuit (IC) chip attached thereto with solder interconnect. A low modulus high elongation (LMHE) dielectric material is preferably employed to absorb strain due to expansion mismatch again between, for example, an FR4-type printed circuit board and a packaged IC chip module.

A preferred formulation for this LMHE dielectric material, optimized for application by spray coating, is formulated by combining 600 grams of acrylated aromatic urethane oligomer with functionality of 2.3 and a molecular weight of 1500 available from UCB Chemicals of Smyrna, Ga. as EBE 6700™; 680 grams of propylene glycol methyl ether acetate, available from Shipley of Marlborough, Mass.; 18 grams of 2-benzyl-2-N-N-dimethylamino-1-(4-morpholinophenyl)-1-butanone photo initiator available from Ciba-Geigy Corporation of Hawthorne, N.Y. as Irgacure 369™; 12 grams of methacryloxypropyl trimethoxysilane available from Silar of Scotia, N.Y. and 2.4 grams of fluoroaliphatic polyester wetting agent, available from 3M Specialty Chemicals of St. Paul, Minn. as FC430™. The combination is mixed thoroughly and filtered through a 1 micron absolute filter to remove any particulate. This material can then be sprayed to form coatings of thickness varying from 20 to 100 microns.

Two structure variations are described herein. Both structures make use of a high elongation and low modulus polymer or dielectric to absorb the expansion differential between the I/O bumps on a package and the circuit board to which they are connected. In one structure the bump is formed by the high compliance polymer and in the other structure the bump is, e.g., solid copper with compliance afforded by the upper layers of dielectric to which the bump is attached. In addition, both structures can be fabricated from individual die formed into a panel or directly on the wafer. Two sets of drawings are provided. FIGS. 1A–1E and 2A–2G depict polymer bumps and solid copper bumps, respectively, processed on a panel. FIGS. 3A–3E and 4A–4G depict polymer bumps and solid copper bumps, respectively, processed directly on a wafer. It should also be noted that the fabrication processes can be the same for a Chip Scale Package (CSP) which contains a single chip and a multichip module (MCM) which contains more than one interconnected IC. Whether a single or multichip module results depends, e.g., on the dicing operation at the end of the process. If the panel or wafer is cut so that more than one chip is included in a module then an MCM is produced.

Figure 1C:
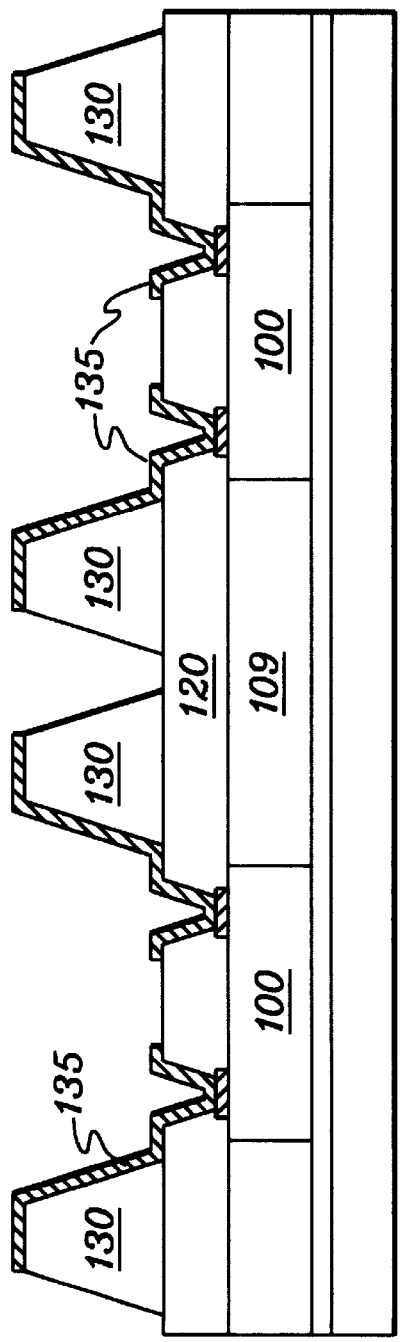
FIG. 1C is a cross-sectional elevational view of the structure of FIG. 1B after formation of compliant polymer bumps and patterning thereof with metallization in accordance with the principles of the present invention.
Figure 3A:
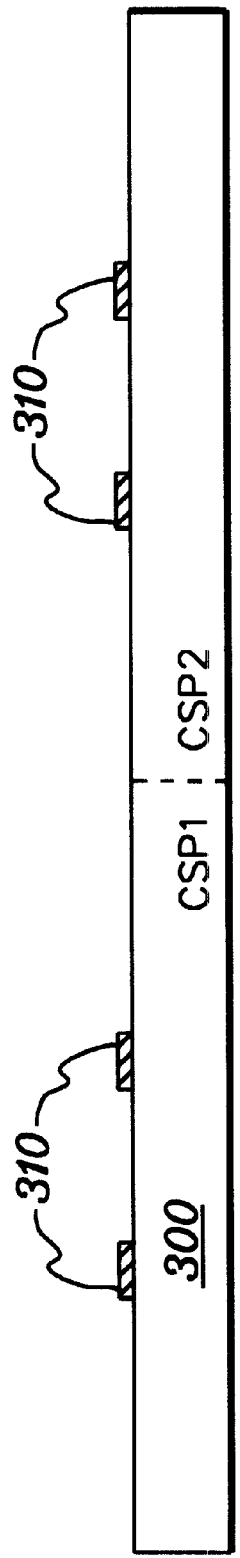
FIG. 3A is a cross-sectional elevational view of one embodiment of a wafer with two integrated circuit chips defined therein to employ a structure in accordance with the principles of the present invention.

FIGS. 1A–1E show one embodiment of the process flow for fabrication of a compliant polymer bump structure in accordance with the principles of the present invention. FIG. 1A is the starting point. Two IC chips 100 with bond pads 110 are shown adhesively mounted 107 on a process carrier 105 and surrounded by filler 109. The fabrication of a panel containing IC chips surrounded by filler is described in U.S. Pat. No. 5,841,193, entitled "Single Chip Modules, Repairable Multi Chip Modules, and Methods of Fabrication Thereof," Issued Nov. 24, 1998, the entirety of which is hereby incorporated herein by reference. However, any method which provides such a panel can be the starting point for the subject invention. FIGS. 3A–3E show similar processing steps except that processing is carried out directly on a wafer. The essential difference is that the steps required to form an array of chips surrounded by filler and mounted on a process carrier are eliminated. For wafer processing FIG. 3A is the starting point. A section of the wafer 300 which contains two IC chips with bond pads 310 is shown. A dotted line shows how the wafer could be sawn to produce two Chip Scale Packages (CSPs), labeled CSP1 and CSP2.

Figure 3B:
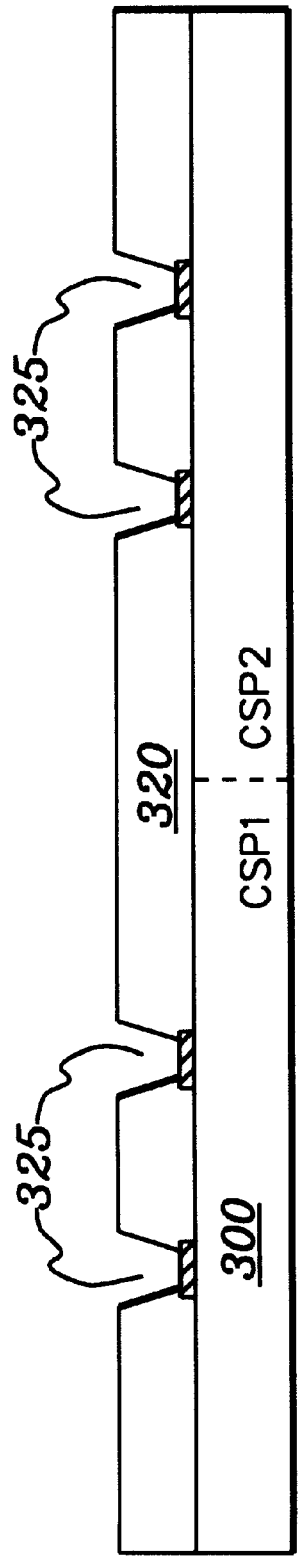
FIG. 3B is a cross-sectional elevational view of the structure of FIG. 3A with a compliant dielectric applied to an upper surface of the wafer and via holes formed in the dielectric to the bond pads of the two integrated circuit chips in accordance with the principles of the present invention.

According to the present invention, a compliant layer of polymer dielectric is sprayed on the top surface of the panel or wafer and soft baked. Characteristics of a preferred low modulus high elongation dielectric are described in the above-incorporated, co-filed and commonly assigned U.S. patent application entitled "Integrated Circuit Structures and Methods Employing a Low Modulus High Elongation Photodielectric." This co-filed application details a polymer which has sufficiently low modulus and sufficiently high elongation and which has the other properties necessary for via formation and metallization. In addition, this application also details appropriate primer layers and methods of application. The primer layers increase adhesion and improve performance in environmental testing. The compliant layer is preferably sprayed to a thickness of 40 to 60 microns. The polymer is soft baked 30 minutes at 95C. Vias of 60 micron diameter are photo patterned in this layer by exposing it to a total energy of 25 mJ/cm$^2$ at 365 nM. Next the dielectric is developed in a dip developer for 1:20 minutes using a 1 part to 2 part mixture of Propylene glycol methyl ether in propanol. The dielectric is UV flooded with an energy of 4 Joule. A 30% $CF_4/O_2$ plasma of 400 W in an LFE 1000 barrel etcher for 10 minutes is used to enlarge the via holes, remove polymer residue from the base of the via hole and texture the surface for improved adhesion of the metallization to the polymer surface. FIG. 1B shows the compliant dielectric 120 applied to the top surface of the panel with via holes 125 formed in the dielectric down to pads 110 of the IC chips 100. FIG. 3B shows the compliant dielectric 320 applied and patterned with via holes 325 to the IC pads 310 on wafer 300.

Next, a compliant dielectric, such as the same polymer, is sprayed to a thickness of, for example, 100 microns. The polymer is soft baked 30 minutes at 95C. 200 micron bumps can be exposed by exposing the structure to a total energy of 125 mJ. This is followed by dielectric development for 3:00 minutes. The bumps are UV flooded with an energy of 4. Joule/cm$^2$ and then post baked at 150C for 30 minutes. Plasma is used to texture the polymer surface to promote adhesion and remove any residual polymer from the via holes. A 30% $CF_4/O_2$ plasma of 400 W in an LFE 1000 barrel etcher for 15 minutes is used. FIGS. 1C & 3C depict the resultant polymer bumps 130 & 330, respectively.

A seed layer of cooper metallization is next applied to the polymer surface and in the via holes making connection to the underlying circuit pads. The presently preferred technique for copper seed metallization employs catalyzation and electroless copper metallization techniques. The above-incorporated, co-filed and commonly assigned U.S. patent application entitled "Electroless Metal Connection Structures and Methods" details one process for electroless metallization of IC bond pads. Additionally, U.S. Pat. No. 5,841,193, details sputter metallization techniques for direct connection to IC bond pads. This seed layer is covered with electro deposited resist available from Shipley Corporation of Newton, Mass. The resist is patterned to form conductors from the via holes to the tops of the compliant bumps. The metallization preferably covers the entire tops of the compliant bumps, but only a relatively thin line is formed from the top of the bump to the surface of the dielectric. This facilitates ease of displacement of the bumps by not having a thick layer of copper over all of the compliant bump surface. The metal is then pattern plated to a thickness of, e.g., 10 microns. This is followed by stripping of the resist by plasma etching in a 30% $CF_4/O_2$ plasma and stripping of the seed copper layer in Ammonium Persulfate. FIGS. 1C and 3C show the completed compliant polymer bumps 130 & 330 with patterned metallization 135 & 340, respectively. Note that only one metallization and patterning step is required to form both the Metal 1 interconnect and the metallization pattern on the bumps.

A self-patterning solder mask layer is formed by spraying the compliant polymer to a thickness of 40 microns, soft baking at 95C for 30 minutes and UV flooding at 4 Joules/cm$^2$. A bake of 1 hour at 150C follows. This mask layer tends to flow off the top of the bumps and also fills in the via holes and partially covers the conductor layer. To be sure that the polymer is off the metal on tops of the bumps, a plasma etch in $CF_4/O_2$ at 400 W for 20 minutes can be conducted. Note that the solder mask completely surrounds the base of each bump providing the solder masking feature as well as providing distribution and leveling of stresses on the bumps. The process is completely self-aligning to the bumps and does not require a photo masking step.

Figure 1D:
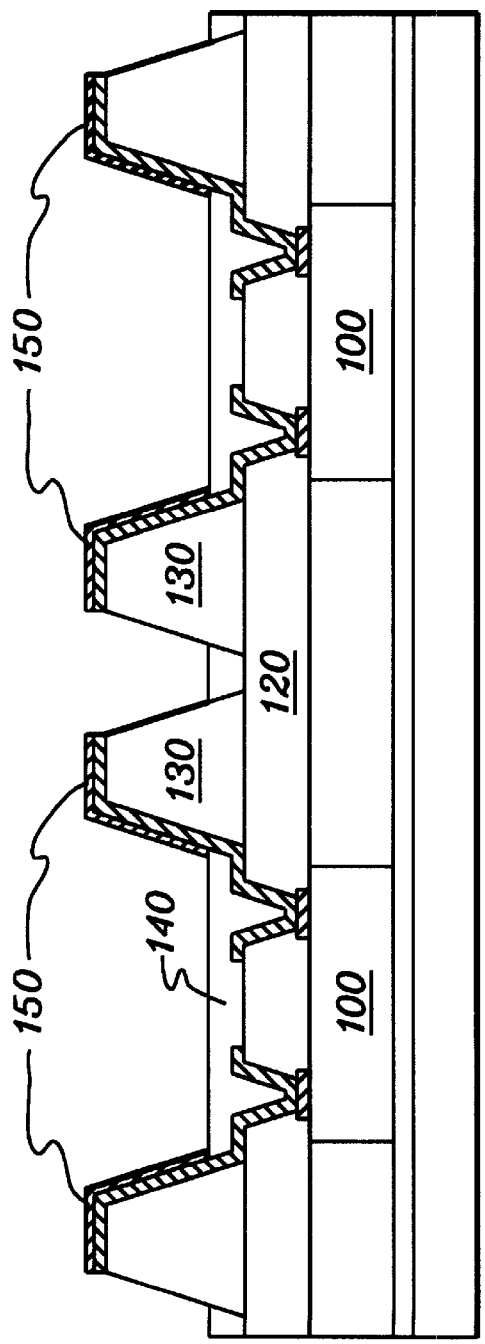
FIG. 1D is a cross-sectional elevational view of the structure of FIG. 1C after application of a self-patterning solder mask and the formation of a solderable finish on exposed portions of metallization on the compliant polymer bumps in accordance with the principles of the present invention.

To enhance and preserve solderability, an electroless layer of nickel followed by immersion gold is preferably applied to the exposed copper of the bumps. The copper is first etched in ammonium persulfate to remove oxide and then, e.g., the Ronamax nickel gold finishing process available from Lea Ronal of Freeport, N.Y. is applied. FIGS. 1D and 3D show the completed panel with solder masks 140, 350 and selectively applied solderable nickel/gold finishes 150, 360, respectively.

Figure 1E:
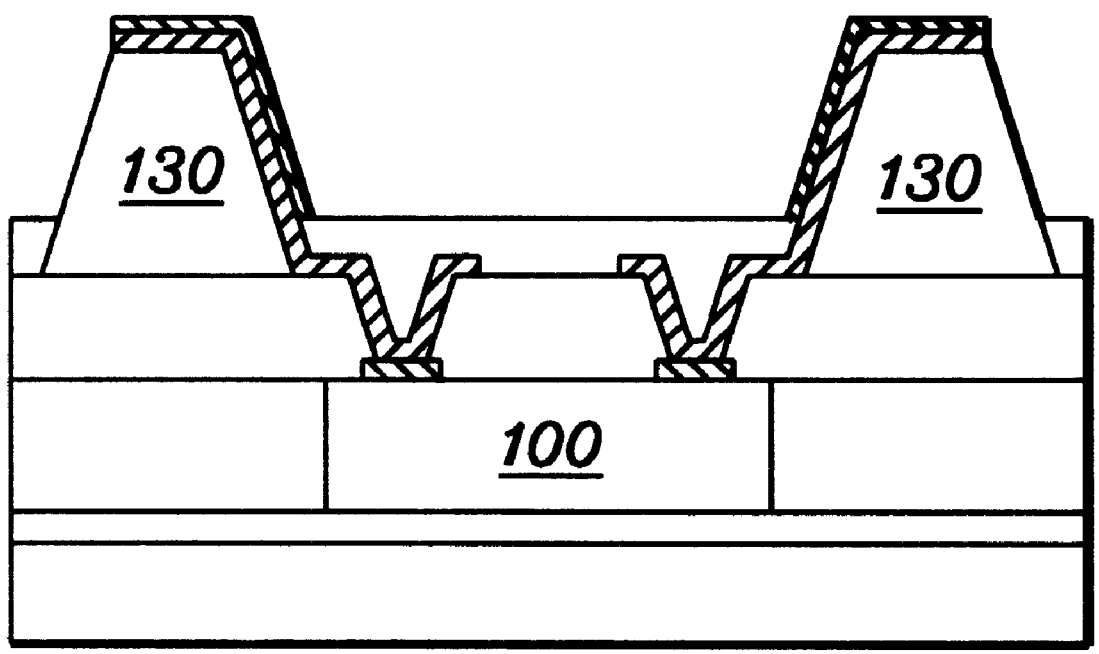
FIG. 1E is a cross-sectional elevational view of a chip scale package formed from singulation of the structure of FIG. 1D in accordance with the principles of the present invention.
Figure 3E:
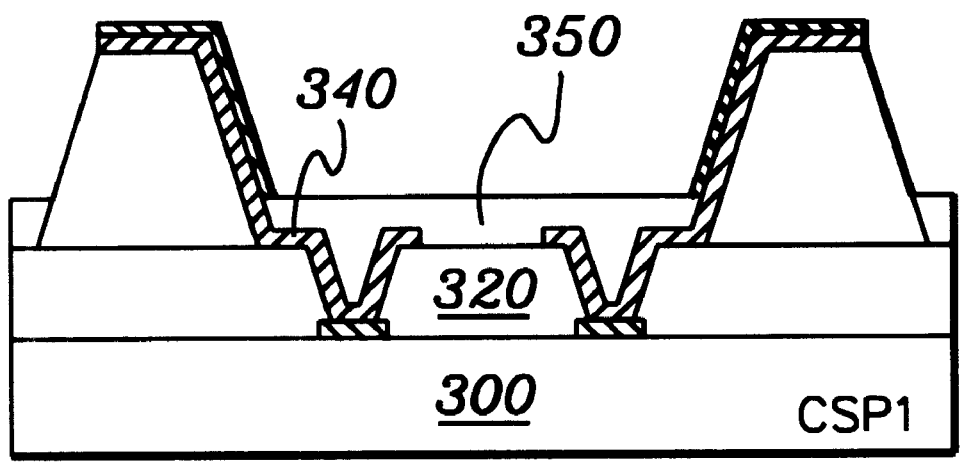
FIG. 3E is a cross-sectional elevational view of a chip scale package (CSP) singulated from the structure of FIG. 3D in accordance with the principles of the present invention.

A CSP module can be completed by sawing the panel (FIG. 1D) or wafer (FIG. 3D) into single modules. The operation of dicing a panel or wafer is well known in the art. For example, singulation can be done using a Disco 320 saw available from Disco Corporation of Tokyo, Japan. FIG. 1E and FIG. 3E show the completed singulated module 160 and 370 sawn from the process panel or wafer, respectively. Note that while one IC chip is shown here producing a Chip Scale Package (CSP), the panel or wafer could have been sawn to form multiple chip modules (MCMs) which enjoy the same advantages of the compliant bump structure described above.

Figure 5C:
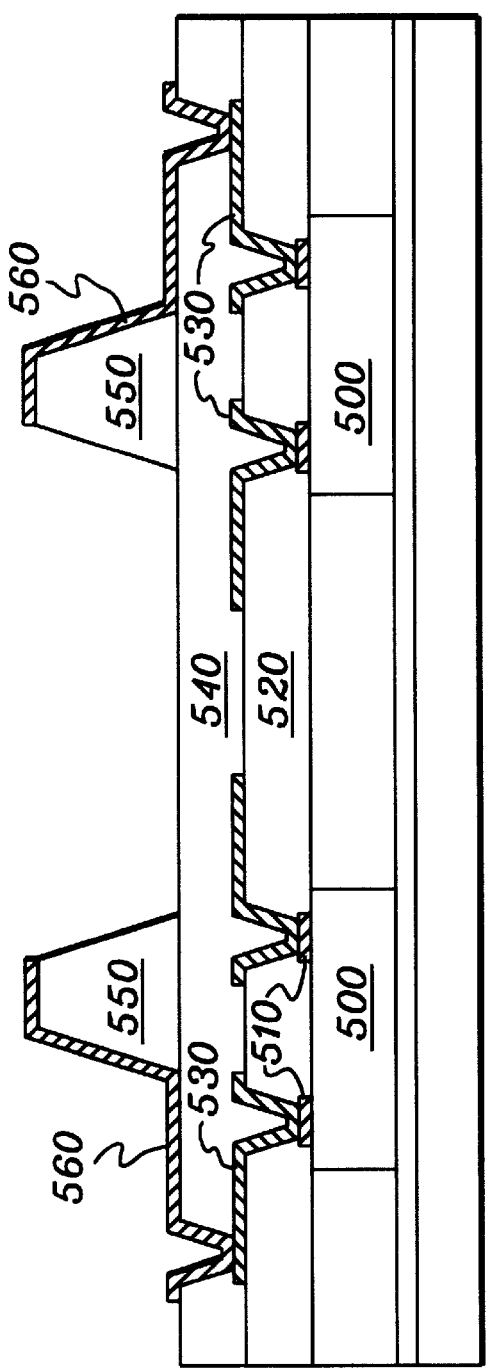
FIG. 5C is a cross-sectional elevational view of the structure of FIG. 5B after a second metal layer has been applied and patterned to make connection in the via openings of the second dielectric layer and to cover the top of the compliant bumps in accordance with the principles of the present invention.

FIGS. 5A–5E show one embodiment of a process flow for fabrication of a multilayer structure with the compliant polymer bump in accordance with the principles of the present invention. FIG. 5A is the starting point. Two IC chips 500 with bond pads 510 are shown adhesively mounted 507 on a process carrier 505 and surrounded by filler 509. A first dielectric layer 520 is applied to the top of the IC chips and filler material and vias 525 are formed in the dielectric down to the bond pads 510 of the ICs. Metallization 530 is applied and patterned to form the interconnect patterns. This process is as described above. Any method which provides connection to the IC chips and which results in patterned metal which can be contacted by a subsequent metal layer can be the starting point for this aspect of the subject invention. It is preferred but not required that dielectric layer 520 be formed from compliant dielectric since this increases the total compliance of the structure.

Figure 9C:
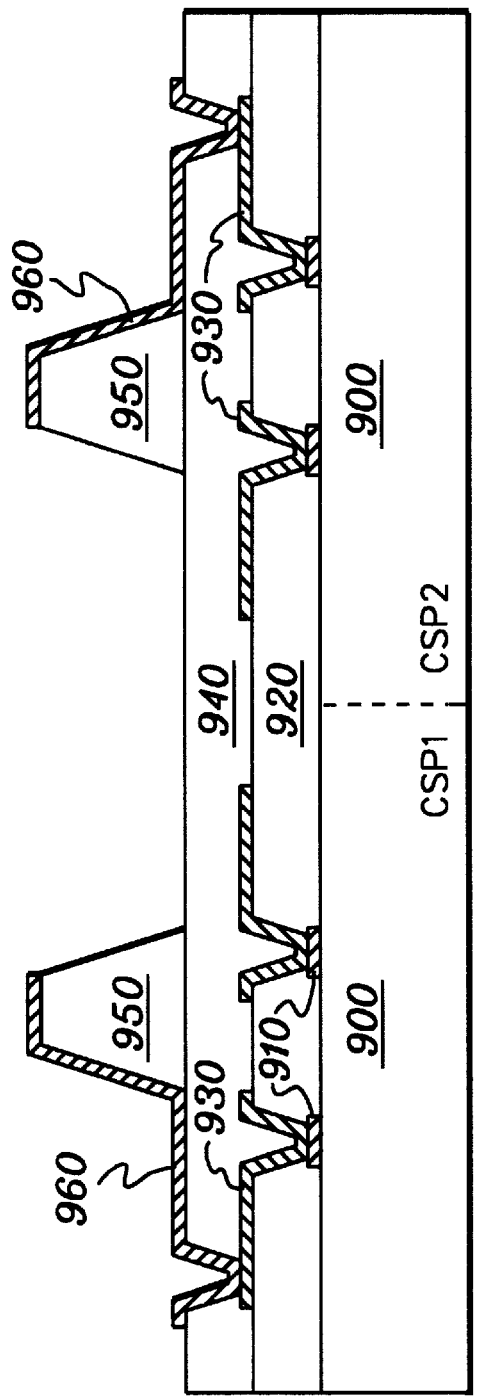
FIG. 9C is a cross-sectional elevational view of the structure of FIG. 9B after application of a second metal layer and patterning thereof to make connections in the via openings of the second dielectric layer and to cover the top portions of the compliant bumps in accordance with the principles of the present invention.
Figure 9D:
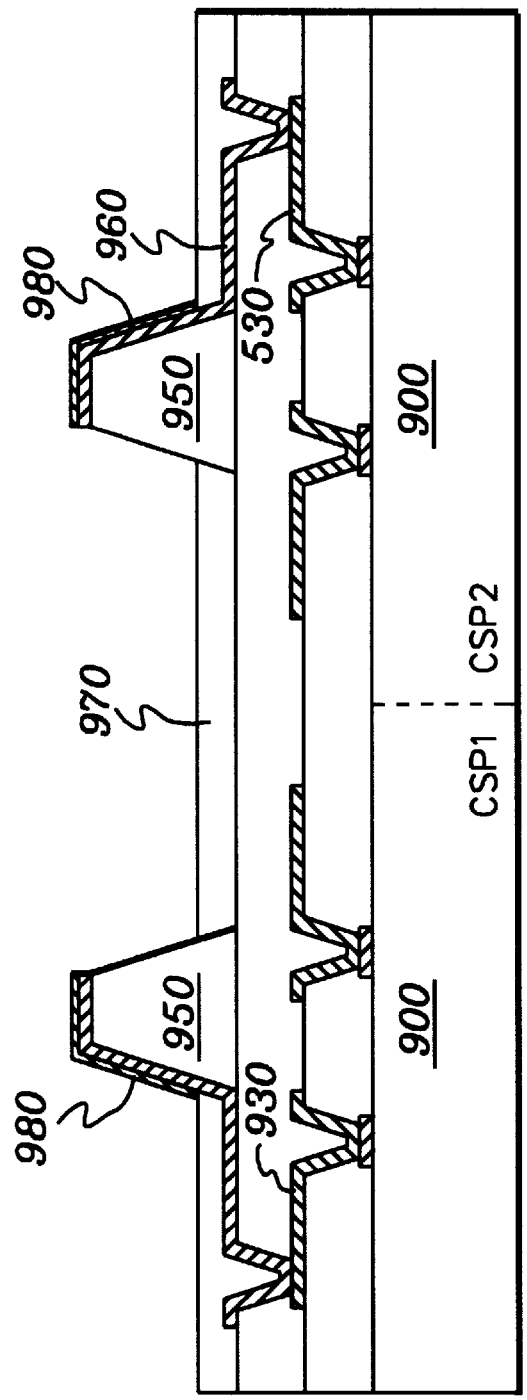
FIG. 9D is a cross-sectional elevational view of the structure of FIG. 9C after application of a self-patterning solder mask and formation of a solderable finish on exposed metallization on the polymer bumps in accordance with the principles of the present invention.
Figure 10:
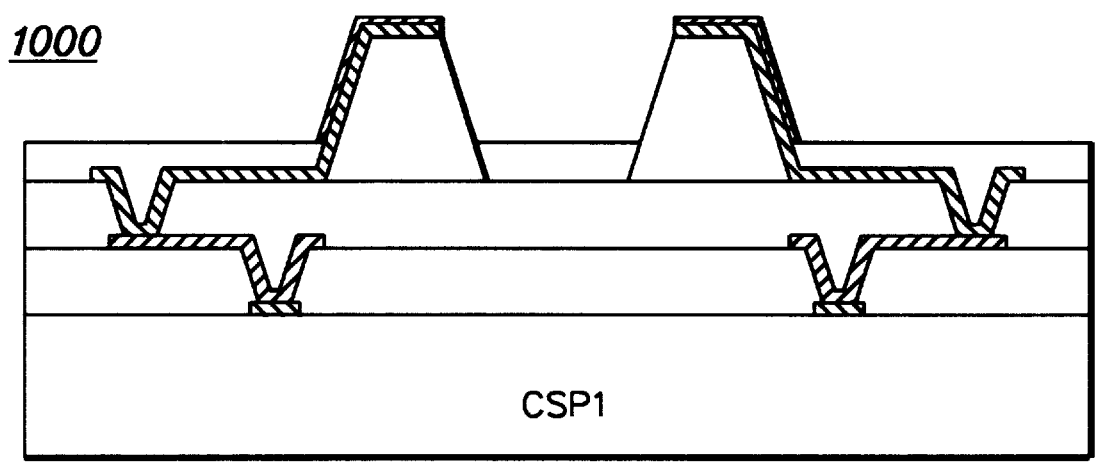
FIG. 10 is a cross-sectional elevational view of a chip scale package (CSP) formed, e.g., from singulation of the structure of FIG. 9D in accordance with the principles of the present invention.

FIGS. 9A–10 depict the same processing steps except that processing is carried out directly on a wafer 900. The essential difference is that the steps required to form an array of chips surrounded by filler and mounted on a process carrier are eliminated. For wafer processing FIG. 9A is the starting point. A section of the wafer 900 which contains two IC chips is shown. A dotted line shows how the wafer would be sawn to produce two Chip Scale Packages (CSPs) labeled CSP1 and CSP2. A first dielectric layer 920 is applied to the top of the IC chips and vias are formed in the dielectric down to the bond pads 910 of the CSPs. Metallization 930 is applied and patterned to form the interconnect patterns. This process is again as described above.

According to the principles of the present invention, a compliant layer of polymer can be sprayed on the first layer dielectric and soft baked. The above-incorporated, co-filed U.S. patent application entitled "Integrated Circuit Structures and Methods Employing a Low Modulus High Elongation Photodielectric" details a polymer which has sufficiently low modulus and sufficiently high elongation and which has the other properties necessary for via formation and metallization. In addition, this above-incorporated application also details appropriate primer layers and methods of application. The primer layers increase adhesion and improve performance in environmental testing. This compliant second layer dielectric is preferably sprayed to a thickness of 40–60 microns. The polymer is soft baked 30 minutes at 95C. Vias of 60 micron diameter can be photo patterned in this layer by exposing it to a total energy of 25 mJ/cm$^2$ at 365 nM. The dielectric is developed in a dip developer for 1:20 minutes using a 1 part to 2 part mixture of Proplyene glycol methyl ether in propanol. The dielectric is UV flooded with an energy of 4 Joule/cm$^2$. A 30% $CF_4/O_2$ plasma of 400 W in an LFE 1000 barrel etcher for 10 minutes is used to enlarge the via holes, remove polymer residue from the base of the via holes and texture the surface for improved adhesion of the metallization to the polymer surface.

Next, the same polymer can be sprayed to a thickness of, e.g., 100 microns. The polymer is soft baked 30 minutes at 95C. 200 micron bumps are then exposed by exposing the structure to a total energy of 125 mJ. This is followed by dielectric development for 3:00 minutes. The bumps are UV flooded with an energy of 4 Joules/cm$^2$ and then post baked at 150C for 30 minutes. Plasma is used to texture the polymer surface to promote adhesion and remove any residual polymer from the via hole. A 30% $CF_4/O_2$ plasma of 400 W in an LFE 1000 barrel etcher for 15 minutes can be used. The resulting structures are shown in FIGS. 5B and 9B for panel and direct wafer processing, respectively. In FIG. 5B, the second layer dielectric 540 is shown patterned with via openings 545 to expose selected portions of metal 1 layer 530. The compliant polymer bumps 550 are each positioned near a respective via opening 545. In FIG. 9B, the second layer dielectric 940 is shown patterned with via openings 945 which again expose selected portions of first metal layer 930. The compliant polymer bumps 950 are positioned as desired, for example, adjacent to a respective via opening 945 in second layer dielectric 940.

A seed layer of copper metallization is next applied by using catalyzation and electroless copper metallization techniques, which are well known in the printed circuit industry. This seed layer is covered with electro deposited resist available, e.g., from Shipley Corporation of Newton, Mass. The resist is patterned to form conductors from the via holes to the tops of the compliant bumps. The metallization preferably covers the entire tops of the compliant bumps, but only a relatively thin line (or lines) is formed from the top of each bump to the surface of the second layer dielectric. This facilitates the ease of displacement of the bumps by not having a thick layer of copper over all of the compliant bump surfaces. The metal is then pattern plated to a thickness of, e.g., 10 microns. This is followed by stripping of the resist by plasma and etching of the seed copper layer in Ammonium Persulfate. FIGS. 5C and 9C show the completed compliant polymer bumps with attached metallization. Note that only one metallization and patterning step is required to form both the metal 2 interconnect and the metallization pattern of the bumps. In FIG. 5C, the metal 2 interconnect 560 is shown to electrically couple the top surface of each compliant bumps 550 to the metal 1 interconnect 530 through the via openings in the second dielectric layer 540. In FIG. 9C, metal 2 interconnect 960 connects the upper surfaces of compliant bumps 950 with metal 1 layer 930 through the via openings formed in the second layer dielectric.

A solder mask layer is next formed by spraying the compliant polymer layer to a thickness of 40 microns, soft baking at 95C for 30 minutes and UV flooding at 4 Joules/cm$^2$. A bake of 1 hour at 150C follows. This layer is self-patterning in that it tends to flow off the tops of the bumps, fill in the via holes, and cover portions of the metal 1 layer. To be sure that the polymer is off the metal on top of the bumps, a plasma etch in $CF_4/O_2$ at 400 W in an LFE 1000 barrel etcher for 20 minutes can be conducted. Note that the resultant solder mask completely surrounds the base of each bump providing the solder masking feature as well as providing distribution and leveling of stresses on the bumps. The process is completely self-aligning to the bumps and does not require a photo masking step.

Figure 5D:
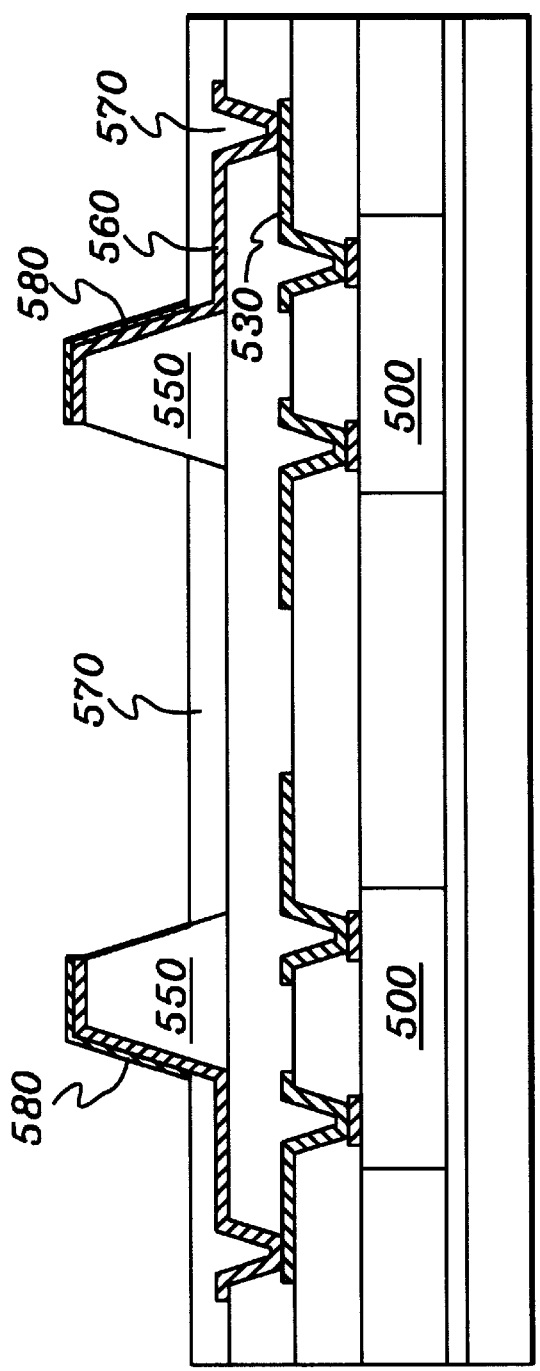
FIG. 5D is a cross-sectional elevational view of the structure of FIG. 5C showing application of a self-patterning mask and a solderable finish to exposed portions of the metal 2 layer on the compliant bumps in accordance with the principles of the present invention.

To enhance and preserve solderability, an electroless layer of nickel followed by immersion gold is preferably applied to the exposed copper of the bumps. The copper is first etched in ammonium persulfate to remove oxide and then, e.g., the Ronamax nickel gold finishing process available from Lea Ronal of Freeport, N.Y. can be applied. FIGS. 5D and 9D show the completed panel with solder mask 570, 970 and selectively applied solderable nickel/gold finishes 580, 980, respectively.

Figure 6:
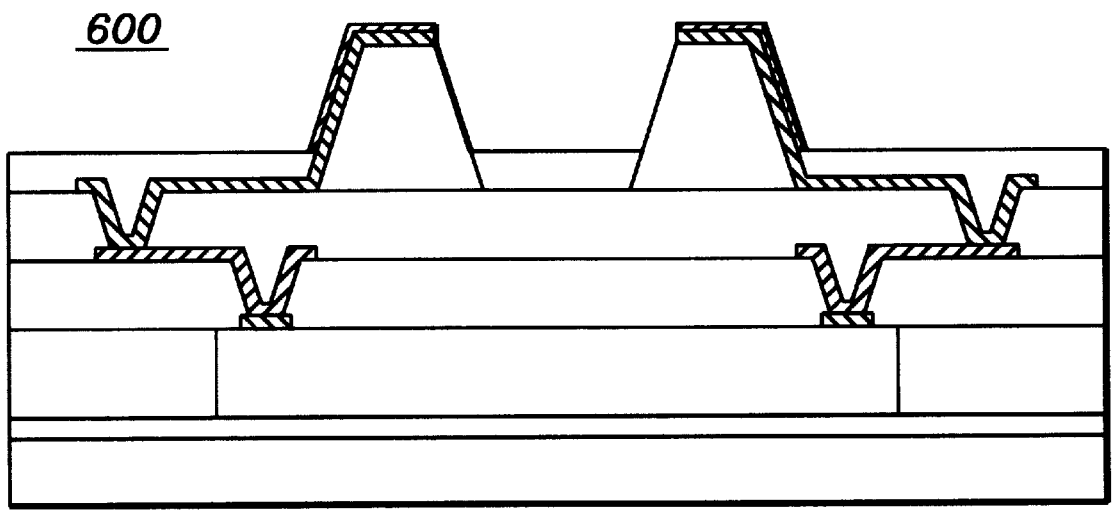
FIG. 6 is a cross-sectional elevational view of a structure such as depicted in FIG. 5D after singulation of packaged integrated circuit chips in accordance with the principles of the present invention.

A CSP module can be completed by sawing the panel or wafer into single modules. The operation of dicing a panel or wafer is well known in the art. For example, singulation can be done using a Disco 320 available from Disco Corporation of Tokyo, Japan. FIG. 5D might comprise a multilayer chip scale package (CSP) sawn from a panel, while FIG. 6 shows a multilayer multichip module 600 sawn from a panel. FIG. 10 shows a completed multilayer chip scale package (CSP) module 1000 singulated from a wafer. Note that MCMs enjoy the same advantages of the compliant bump structure as do CSPs. Note also that while the process has been described in terms of 2 metal layers, multiple dielectric and metal layers can be provided by repeating the steps described.

Figure 2F:
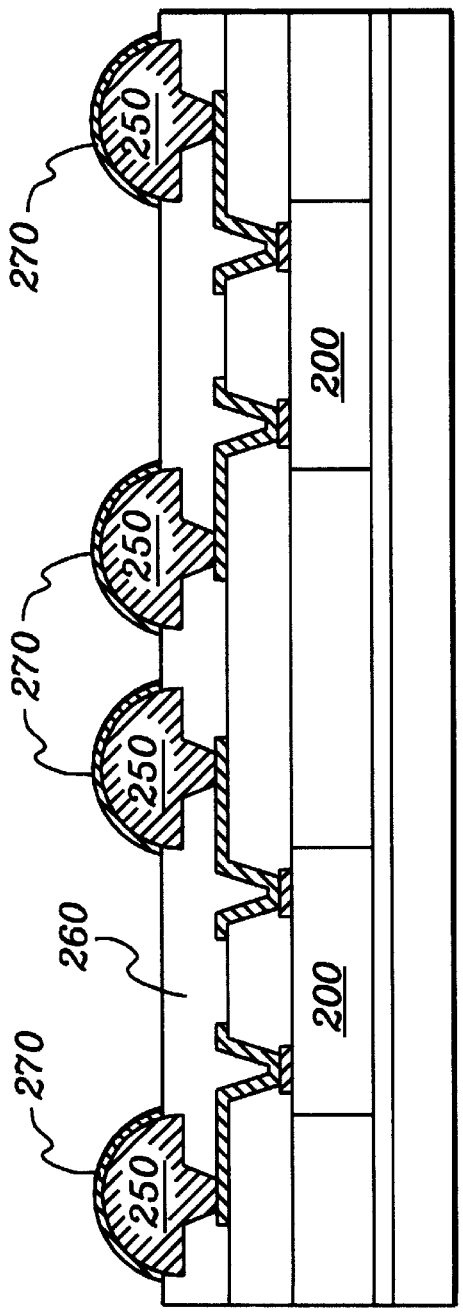
FIG. 2F is a cross-sectional elevational view of the structure of FIG. 2E after a self-patterning solder mask has been applied, and a solderable finish formed over the exposed surfaces of the conductive mushroom-shaped bumps in accordance with the principles of the present invention.
Figures 4A, 4B, 4C:
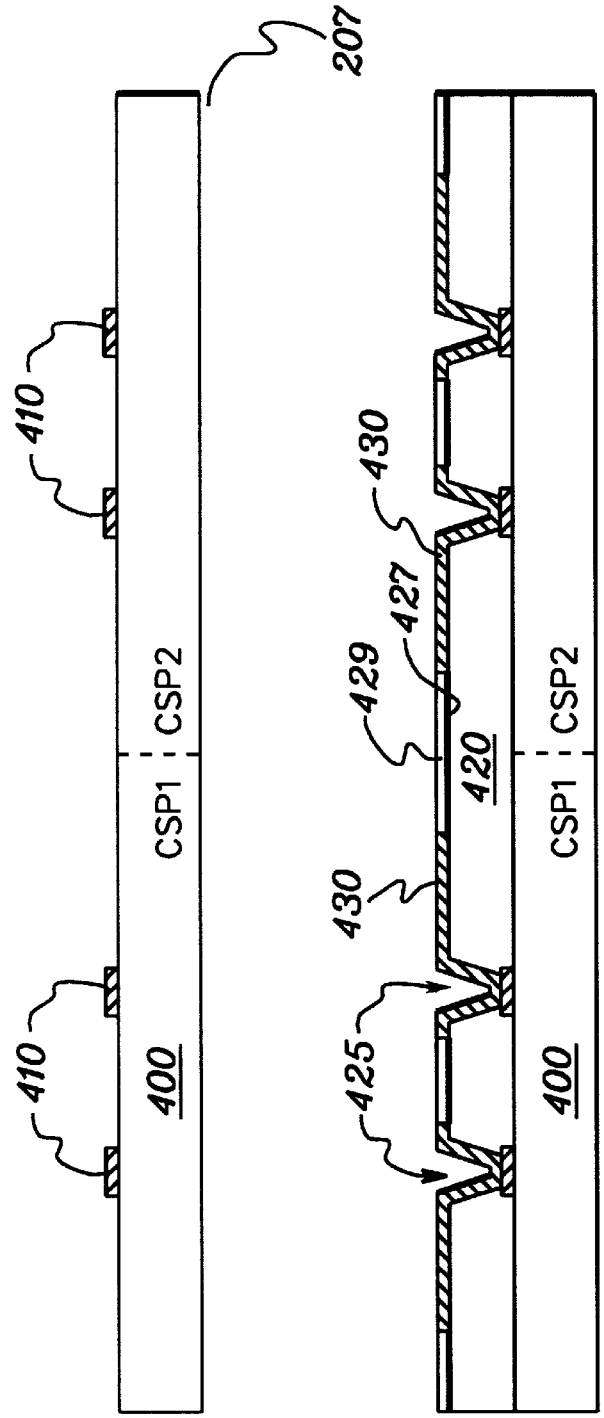
FIG. 4A is a cross-sectional elevational view of one embodiment of a wafer with two integrated circuit chips defined therein to employ a structure in accordance with the principles of the present invention.
FIG. 4B is a cross-sectional elevational view of the structure of FIG. 4A with a compliant dielectric layer shown thereon formed and patterned with via holes, and with a seed metal layer applied, electro-deposited resist applied and patterned, and a metal layer plated up as defined by the resist in accordance with the principles of the present invention.
FIG. 4C is a cross-sectional elevational view of the structure of FIG. 4B with a positive resist applied and patterned with via openings to expose portions of the metal layer where interconnection bumps are to be grown in accordance with the principles of the present invention.

FIGS. 2A–2G show the process flow for fabrication of a solid copper bump over compliant dielectric structure in accordance with another aspect of the present invention. FIG. 2A is the assumed starting point. Two IC chips 200 with bond pads 210 are shown adhesively mounted 207 on a process carrier 205 and surrounded by filler 209. Again, the fabrication of a panel containing IC chips surrounded by filler is described in U.S. Pat. No. 5,841,193, entitled "Single Chip Modules, Repairable Multi Chip Modules, and Methods of Fabrication Thereof," Issued Nov. 24, 1998. However, any method which provides such a panel can be the starting point for the subject invention. FIGS. 4A–4G show the same processing steps except that processing is carried out directly on a wafer 400. The essential difference is that the steps required to form an array of chips surrounded by filler and mounted on a process carrier are eliminated. For wafer processing FIG. 4A is the assumed starting point. A section of the wafer 400 which contains two IC chips with bond pads 410 is shown. A dotted line shows how the wafer would be sawn to produce two Chip Scale Packages (CSPs) labeled CSP1 and CSP2.

According to this aspect of the present invention, a compliant layer of polymer (dielectric 1) is sprayed on the surface of the panel or wafer and soft baked. The compliant layer is preferably sprayed to a thickness of 40–60 microns. The polymer is soft baked 30 minutes at 95C. Vias of 60 micron diameter can be photo patterned in this layer by exposing it to a total energy of 25 mJ/cm$^2$ at 365 nM. The dielectric is developed in a dip developer for 1:20 minutes using a 1 part to 2 part mixture of Proplyene glycol methyl ether in propanol. The dielectric is UV flooded with an energy of 4 Joule/cm$^2$. A 30% $CF_4/O_2$ plasma of 400 W in an LFE 1000 barrel etcher for 15 minutes is used to enlarge the via holes, remove polymer residue from the base of the via holes and texture the surface for improved adhesion of the subsequent metallization to the polymer surface.

Next, a seed layer of copper metallization is applied to the polymer surface and in all the via holes making connection to the underlying circuit pads. One technique for copper seed metallization uses catalyzation and electroless copper metallization. The above-incorporated, co-filed patent application entitled "Electroless Metal Connection Structures and Methods," details one process for electroless metallization of IC bond pads. Additionally, U.S. Pat. No. 5,841,193, details sputter metallization techniques for connection to IC bond pads. This seed layer is covered with an electro deposited resist available, e.g., from Shipley Corporation of Newton, Mass. The resist is patterned to form conductors from the via holes over the surface of dielectric 1. The metallization preferably forms a large circle to form the base of each bump. The metal is then pattern plated to a thickness of, e.g., 10 microns. FIGS. 2B and 4B respectively show the resultant compliant dielectric 220, 420 with via holes 225, 425, seed copper applied 227, 427, electro deposited resist 229, 429 applied and patterned and metal 1 layer 230, 430 plated up as defined by the resist. In a next step in the process, the electro deposited resist 229, 429 is made resistant to subsequent application of solvents by UV flooding with 4 Joules per square cm at 365 nM. This is followed by spray application of a positive resist type AZP 4620 available from Clariant of Sunnyvale, Calif. The resist is preferably coated to a thickness of 25 to 50 microns. This resist is patterned to form small holes in the center of metal 1 bump land circles. Everything else is covered with resist. The holes are preferably 75 micron in diameter. FIGS. 2C and 4C show the positive resist 240, 440 with patterned holes 245, 445. Bumps are formed by electroplating until a bump of 100 microns height is formed. As the bump plates it grows both up and out once the copper is above the resist. This forms a mushroom shape with a stem as depicted in FIGS. 2D and 4D. In FIG. 2D, the resultant mushroom-shaped interconnect bumps 250 are shown to electrically connect to metal 1 layer 230, while in FIG. 2D, the resultant mushroom-shaped interconnect bumps 450 are shown to electrically connect to first metal layer 430. The a mushroom shape is advantageous because of the combination of sections that make up the bump. The base of the bump is a large circle of copper that provides good adhesion to the top surface of dielectric 1. The top of the bump is the appropriate diameter for soldering to a circuit board. The metal stem between the base of the bump and the top portion of the bump is relatively small in diameter and thereby adds flexibility to the bump structure. This allows the bump to be displaced in lateral dimension and angle without placing undue stress on the structure or the solder joint formed between the bump and the circuit board. the positive resist is next stripped in a 1 part to 2 part solution of Propylene glycol methyl ether in Propanol. A 3:00 minute soak with continuous agitation has been found to be satisfactory. This is followed by stripping of the electro deposited resist in a 25%/75%. $CF_4/O_2$ plasma and etching of the seed copper layer in Ammonium Persulfate. FIGS. 2E and 4E show the solid copper bump structures with the positive and electro deposited resist removed, as well as the seed copper layer outside the metal 1 layer removed.

Figure 4F:
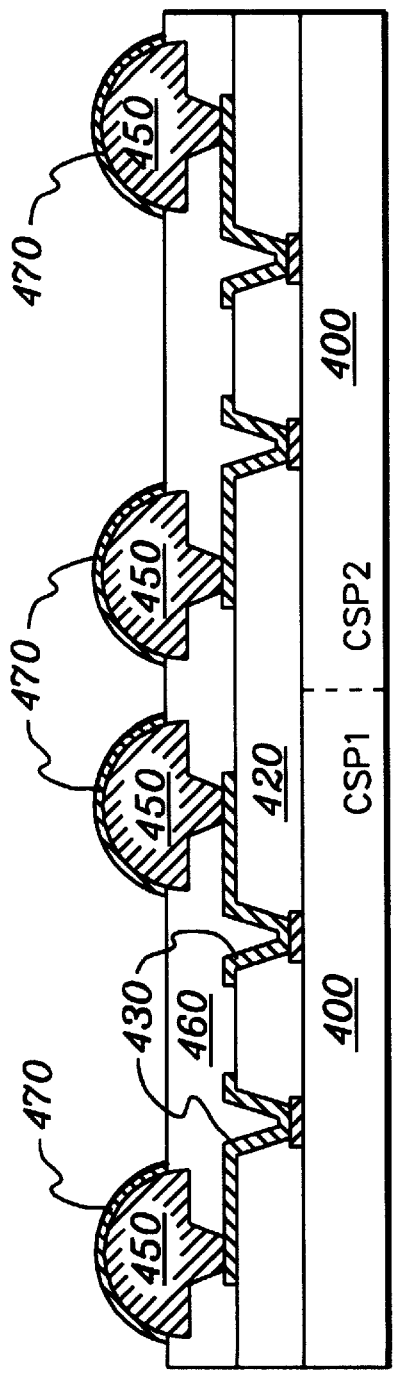
FIG. 4F is a cross-sectional elevational view of the structure of FIG. 4E showing application of a self-patterning solder mask and formation of a solderable finish on exposed portions of the conductive bumps in accordance with the principles of the present invention.

A self-patterning solder mask is formed by spraying the compliant polymer layer to a thickness of 40 microns, soft baking at 95C for 30 minutes and UV flooding at 4 Joules/cm$^2$. A bake of 1 hour at 150C follows. This layer tends to flow off the tops of the bumps, fills in the via holes and partially covers the top conductor layer as shown in FIGS. 2F & 4F. To be sure that the polymer is off the metal on top of the bumps a plasma etch in $CF_4/O_2$ at 400 W in an LFE barrel etcher for 20 minutes can be conducted. Note that the solder mask completely surrounds the base of each bump providing the solder masking feature as well as providing distribution and leveling of stresses on the bumps. The process is completely self-aligning to the bumps and does not require a photo masking step.

To enhance and preserve solderability, an electroless layer of nickel followed by immersion gold can be applied to the exposed copper of the bumps. The copper is first etched in ammonium persulfate to remove oxide and then the Ronamax nickel gold finishing process available from Lea Ronal of Freeport, N.Y. is applied. FIGS. 2F and 4F show the completed panel with solder mask 260, 460 and selectively applied solderable nickel/gold finish 270, 470, respectively.

Figure 2G:
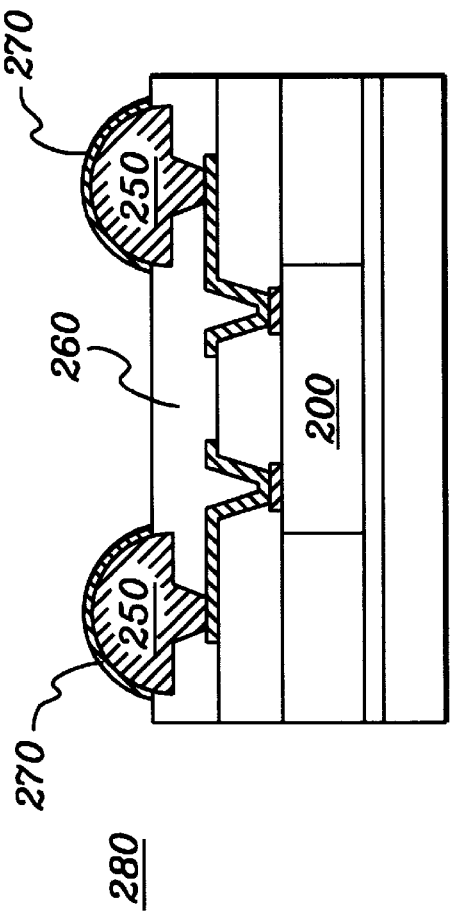
FIG. 2G is a cross-sectional elevational view of a completed chip scale package (CSP) module achieved from singulation of the structure of FIG. 2F in accordance with the principles of the present invention.
Figure 4G:
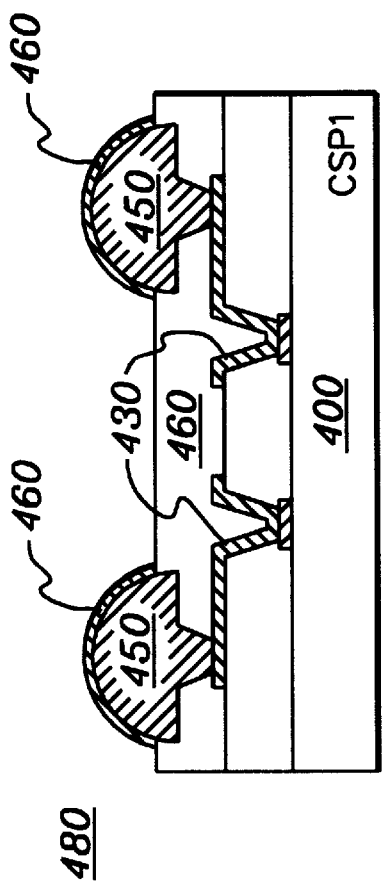
FIG. 4G is a cross-sectional elevational view of a chip scale package (CSP) singulated from the structure of FIG. 4F in accordance with the principles of the present invention.

A CSP module is completed by sawing the panel or wafer into single modules. The operation of dicing a panel or wafer is well known in the art. For example, singulation can be done using a Disco 320 available from Disco Corporation of Tokyo, Japan. FIGS. 2G and 4G show the completed singulated module 280, 480 sawn from the process panel or wafer, respectively. Note that while one IC chip is shown here producing a Chip Scale Package (CSP) the panel or wafer could have been sawn to form multiple chip modules MCMs which enjoy the same advantages of the compliant bump structures described herein.

Figures 7A, 7B:
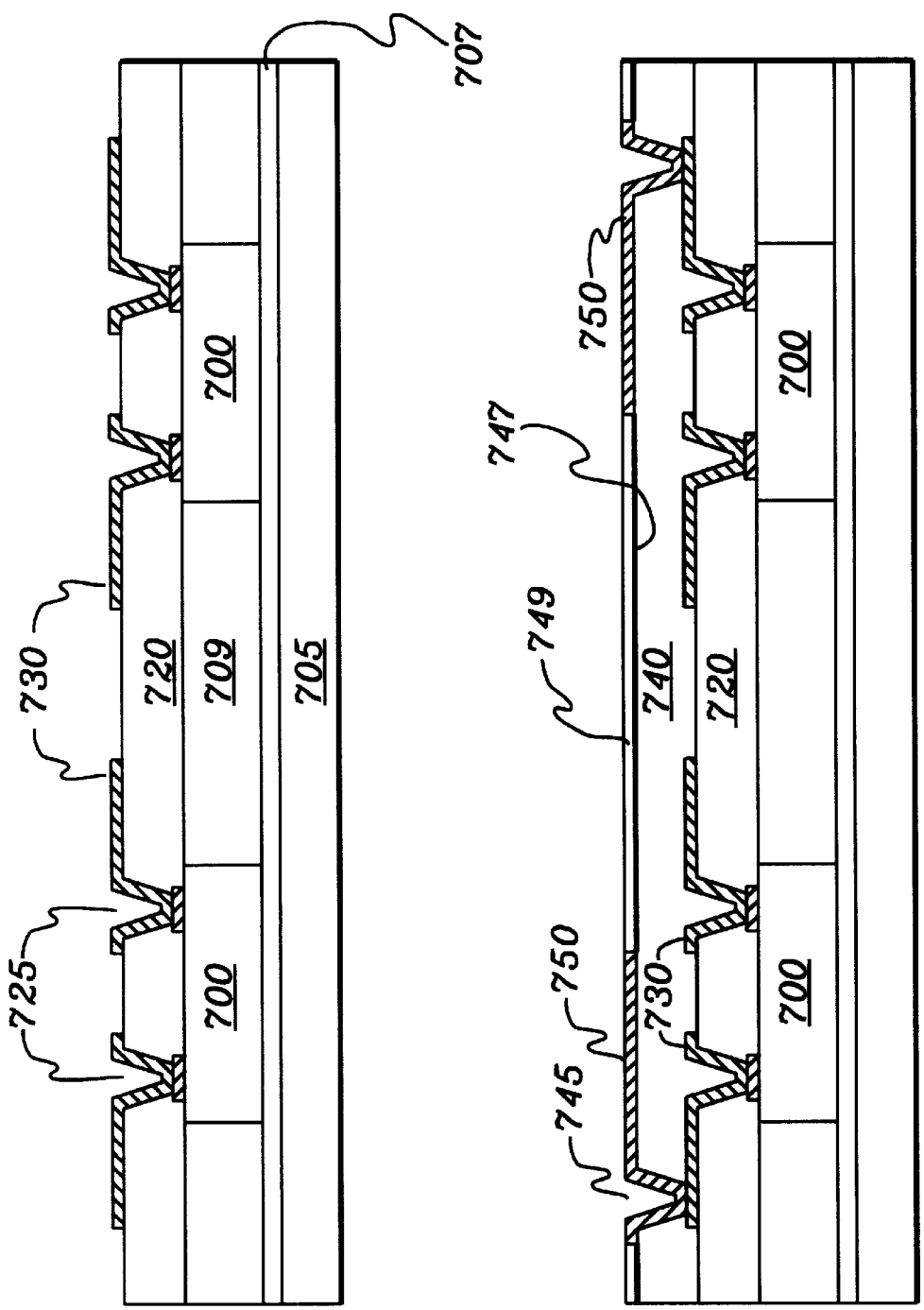
FIG. 7A is a cross-sectional elevational view of one embodiment of a panel of singulated integrated circuit (IC) chips surrounded by filler mounted on a substrate and having a patterned dielectric layer disposed thereon with a metal layer connecting to exposed bond pads of the IC chips in accordance with the principles of the present invention.
FIG. 7B is a cross-sectional elevational view of the structure of FIG. 7A after application of a second dielectric layer and patterning thereof with via holes, application of a seed metal layer, electro-depositing of a resist and patterning thereof, and plating up of a second metal layer in accordance with the principles of the present invention.

FIGS. 7A–7F & 8 show the process flow for fabrication of a multilayer solid copper bump over compliant dielectric structure in accordance with the present invention. FIG. 7A is assumed to be the starting point. Two IC chips 700 with bond pads 710 are shown adhesively 707 mounted on a process carrier 705 and surrounded by filler 709. Dielectric 720 is applied to the top of the IC chips and filler material and vias 725 are formed in the dielectric down to the bond pads 710 of the ICs. Metallization is applied and patterned to form the interconnect patterns 730. The process details to this point are described above. Any method which provides connection to the IC chips and which results in patterned metal which can be contacted by a subsequent metal layer can be the starting point for the subject invention.

Figure 11C:
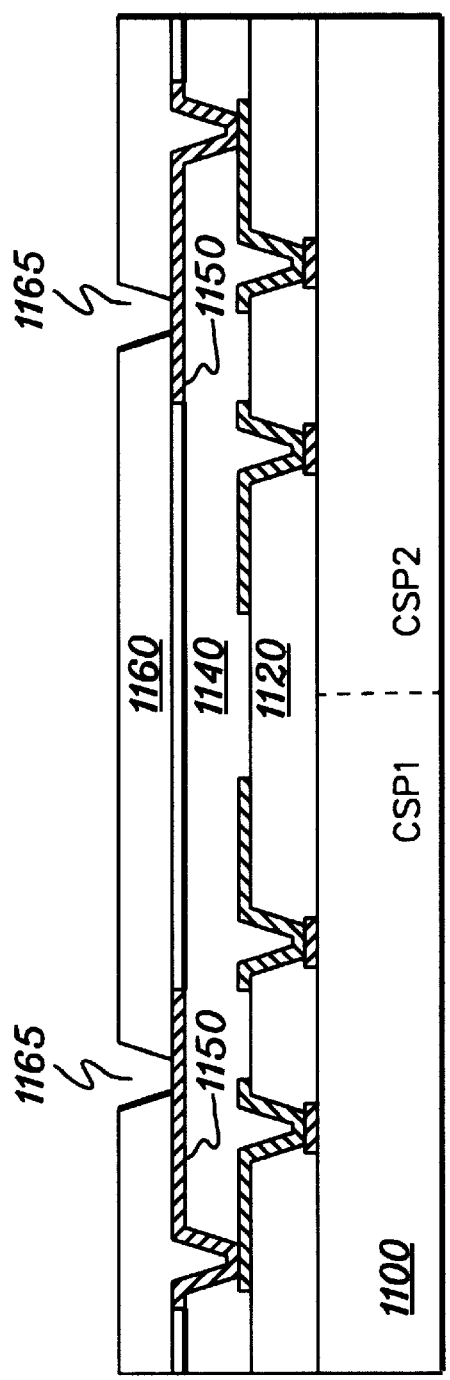
FIG. 11C is a cross-sectional elevational view of the structure of FIG. 11B after depositing of a positive resist and patterning thereof with via openings where conductive bumps are to be grown in accordance with the principles of the present invention.

FIGS. 11A–11F & 12 show the same processing steps outlined above except that processing is carried out directly on a wafer 1100. The essential difference is that the steps required to form an array of chips surrounded by filler and mounted on a process carrier are eliminated. For wafer processing FIG. 11A is the starting point. A section of the wafer 1100 which contains two IC chips is shown. A dotted line shows how the wafer would be sawn to produce two Chip Scale Packages (CSPs) labeled CSP1 and CSP2. The dielectric 1 1120 is deposited and patterned with via openings exposing bond pads 1110 as described above. A metal 1 layer 1130 is then formed extending into the via openings to electrically contact the bond pads as shown.

According to the present invention, a compliant layer of polymer is sprayed on the dielectric 1 layer and soft baked. The compliant layer is preferably sprayed to a thickness of approximately 40 microns. The polymer is soft baked 30 minutes at 95C. Vias of 60 micron diameter are photo patterned in this layer by exposing the structure to a total energy of 25 mJ/cm$^2$ at 365 nM. The dielectric is developed in a dip developer for 1:20 minutes using a 1 part to 2 part mixture of Proplyene glycol methyl ether in propanol. The dielectric is UV flooded with an energy of 4 Joule/cm$^2$. A 30% CF$_4$/O$_2$ plasma of 400 W in an LFE barrel etcher for 15 minutes is used to enlarge the via holes, remove polymer residue from the base of the via holes and texture the surface for improved adhesion of the metallization to the polymer surface.

A seed layer of copper metallization is next applied by using catalyzation and electroless copper metallization techniques which are well known in the printed circuit industry. This seed layer is covered with electro deposited resist available, e.g., from Shipley Corporation of Newton, Mass. The resist is patterned to form conductors from the via holes to the surface of the compliant dielectric. The metallization preferably forms large circles to form the base of the bumps. The metal is then pattern plated to a thickness of, e.g., 10 microns. FIGS. 7B and 1B show compliant dielectric 740, 1140 with via holes 745, 1145, seed copper 747, 1147 applied, electro deposited resist 749, 1149 applied and patterned and metal 2 750, 1150 plated up as defined by the resist.

Figure 7C:
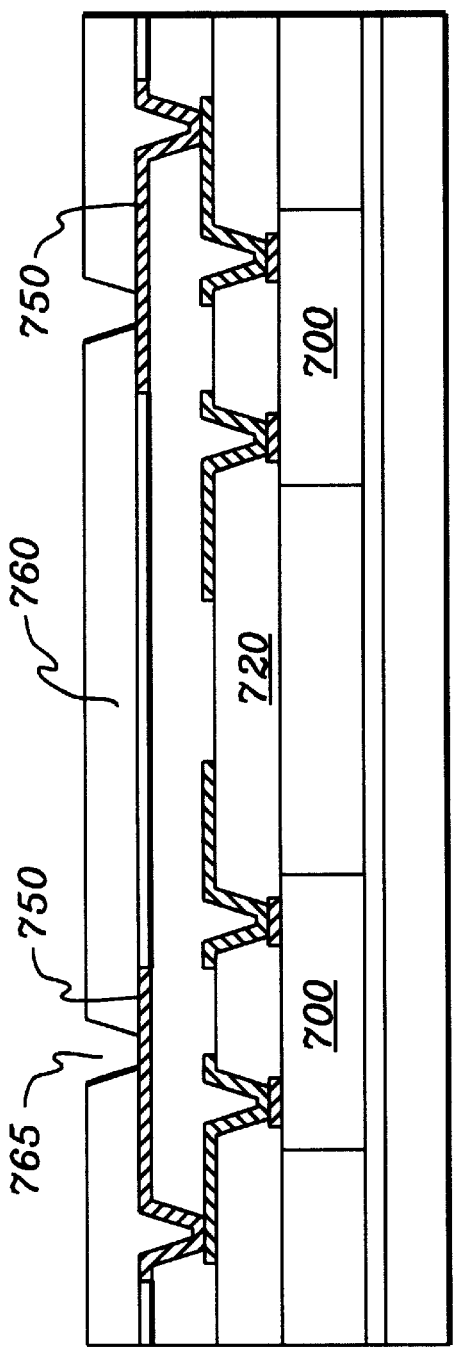
FIG. 7C is a cross-sectional elevational view of the structure of FIG. 7B showing deposition of a positive resist and patterning thereof to expose selected portions of the second metal layer in accordance with the principles of the present invention.
Figure 7D:
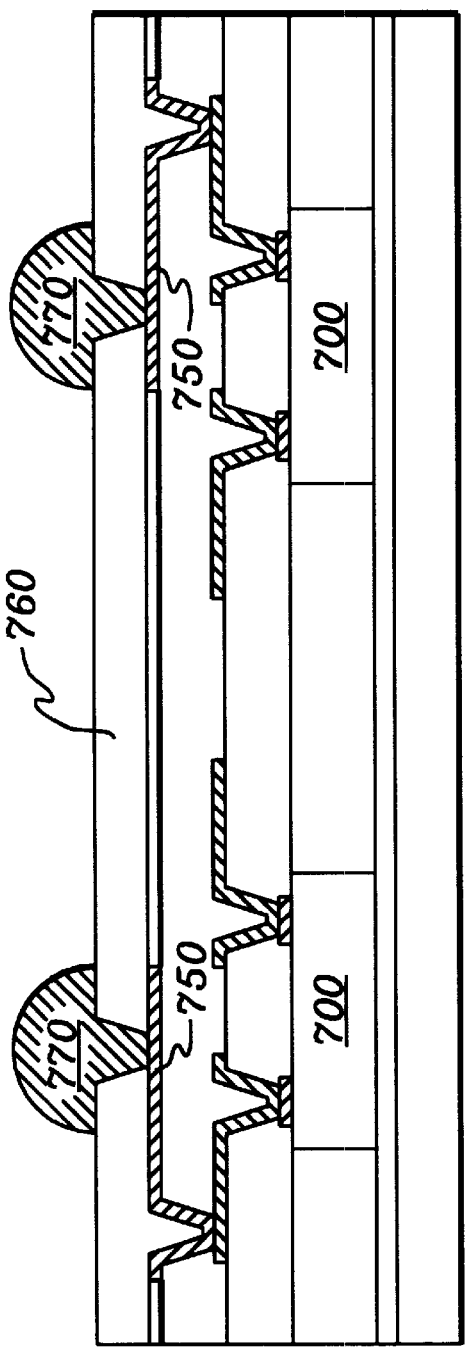
FIG. 7D is a cross-sectional elevational view of the structure of FIG. 7C after plating of conductive bumps in accordance with the principles of the present invention.
Figure 11D:
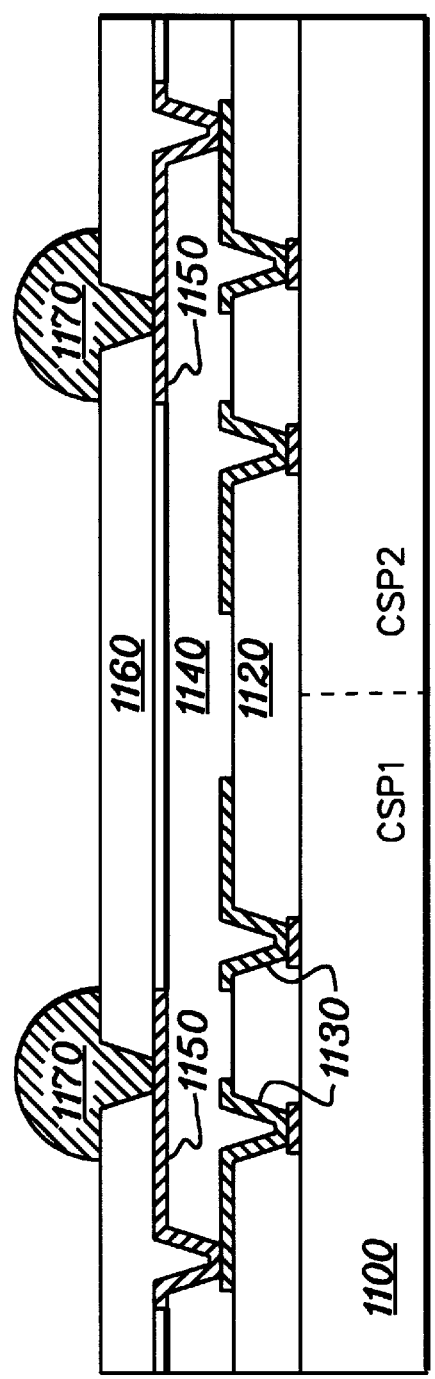
FIG. 11D is a cross-sectional elevational view of the structure of FIG. 11C after conductive bumps have been grown in accordance with the principles of the present invention.

Next, the electro deposited resist is hardened to increase its resistance to subsequent exposure to solvents by flood exposure to 4 Joules per square cm of UV at 365 nM. This is followed by spray application of a positive resist, e.g., type AZP 4620 available from Clariant Corporation, Sunnyvale, Calif. This resist is patterned to form small holes in the center of the metal 2 contact circles. Everything else is covered with resist. The holes may be 75 microns in diameter. FIGS. 7C and 11C show the positive resist with patterned holes. Bumps are formed by electroplating until, e.g., a bump of 100 microns height is formed. As the bump plates it grows both up and out once the copper is above the resist. This forms a mushroom-shaped bump 770, 1170 as depicted in FIGS. 7D and 11D. This mushroom shape is advantageous because of the combination of sections which make up the bump. The base of the bump is a large circle of copper which gives good adhesion to the top surface of the polymer. The top portion of the bump is the appropriate diameter for soldering to a circuit board. The metal stem between the base of the bump and the top portion of the bump is relatively small in diameter and thereby adds flexibility to the bump structure. This allows the bump to be displaced in lateral dimension and angle without placing undue stress on the structure or the resultant solder joint formed between the bump and, e.g., a circuit board.

Figure 7E:
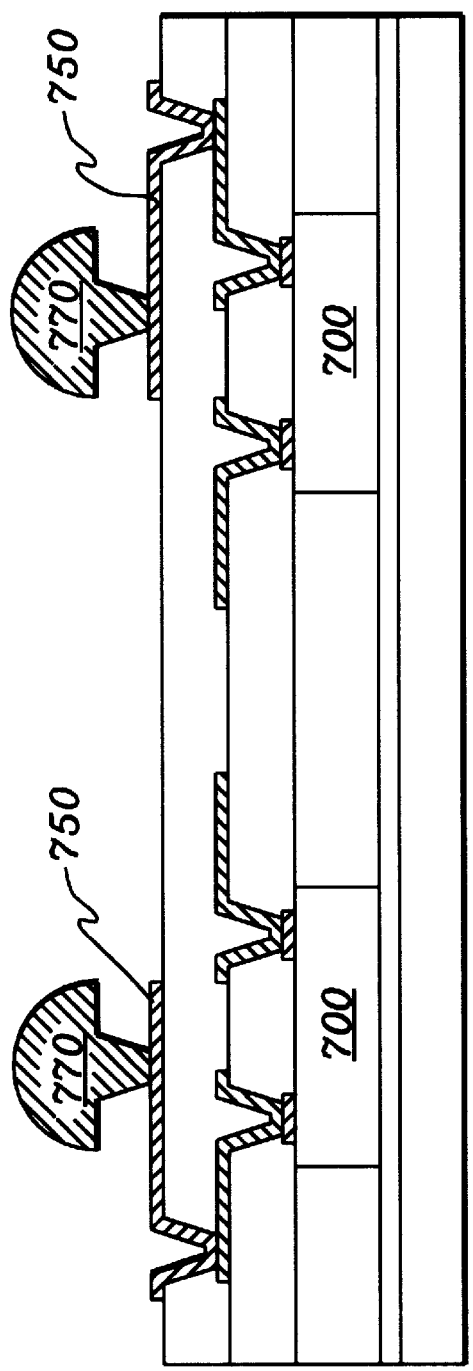
FIG. 7E is a cross-sectional elevational view of the structure of FIG. 7D obtained after removing the positive resist, electro-deposited resist, and seed metal layers in accordance with the principles of the present invention.
Figure 11E:
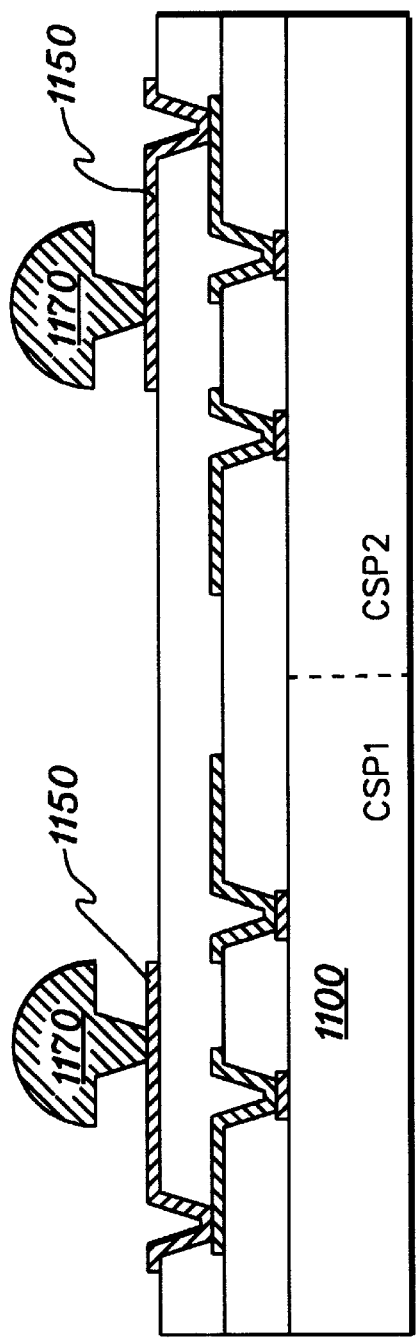
FIG. 11E is a cross-sectional elevational view of the structure of FIG. 11D after removal of the positive resist, electrodeposited resist and seed metal layers in accordance with the principles of the present invention.

The positive resist is stripped in a 1 part to 2 part solution of Propylene glycol methyl ether in Propanol. A 3:00 minute soak with continuous agitation has been found to be satisfactory. This is followed by stripping of the electro deposited resist in a 25%/75% CF$_4$/O$_2$ plasma and etching of the seed copper layer in Ammonium Persulfate. FIGS. 7E & 11E show the solid copper bump structures 770, 1170 with the positive and electro deposited resist removed, as well as the seed copper outside the metal 2 layers.

A self-patterning solder mask layer is next formed by spraying the compliant polymer layer to a thickness of 40 microns, soft baking the structure at 95C for 30 minutes and UV flooding at 4 Joules/cm$^2$. A bake of 1 hour at 150C follows. This layer tends to flow off the top of the bumps, fills in the via holes and partially covers the conductor layer. To be sure that the polymer is off the metal on top of the bumps a plasma etch in CF$_4$/O$_2$ at 400 W in an LFE barrel etcher for 20 minutes can be conducted. Note that the solder mask completely surrounds the base of each bump providing the solder masking feature as well as providing distribution and leveling of stresses on the bumps. The process is completely self-aligning to the bumps and does not require a photo masking step.

Figure 7F:
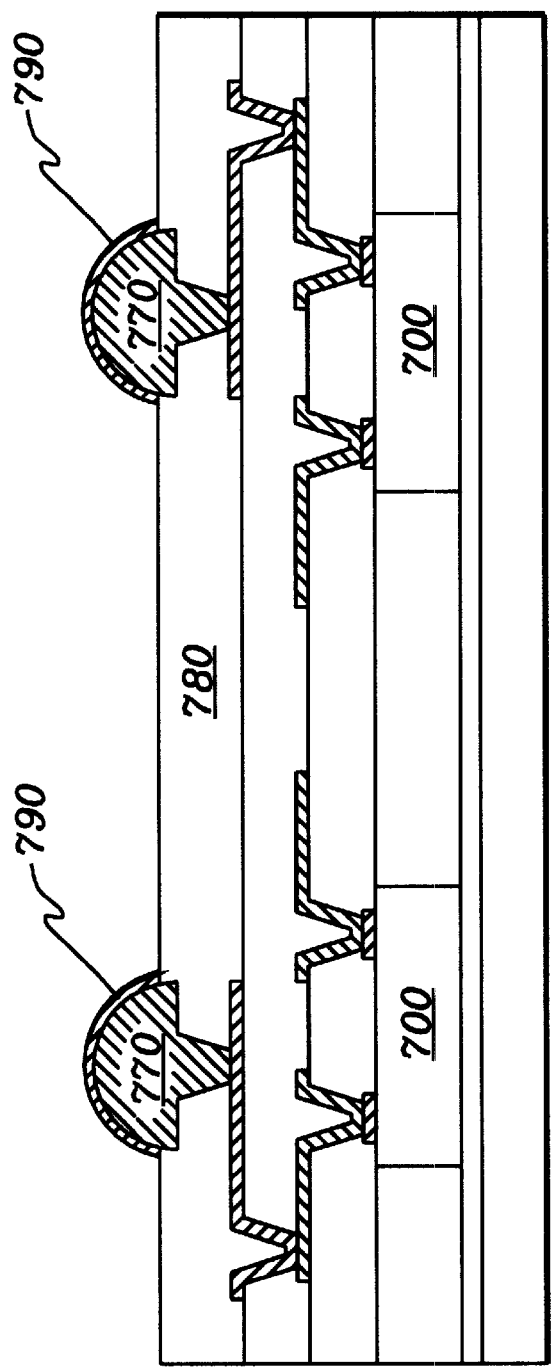
FIG. 7F is a cross-sectional elevational view of the structure of FIG. 7E after application of a self-patterning solder mask and formation of a solderable finish on exposed portions of the conductive bumps in accordance with the principles of the present invention.
Figure 11F:
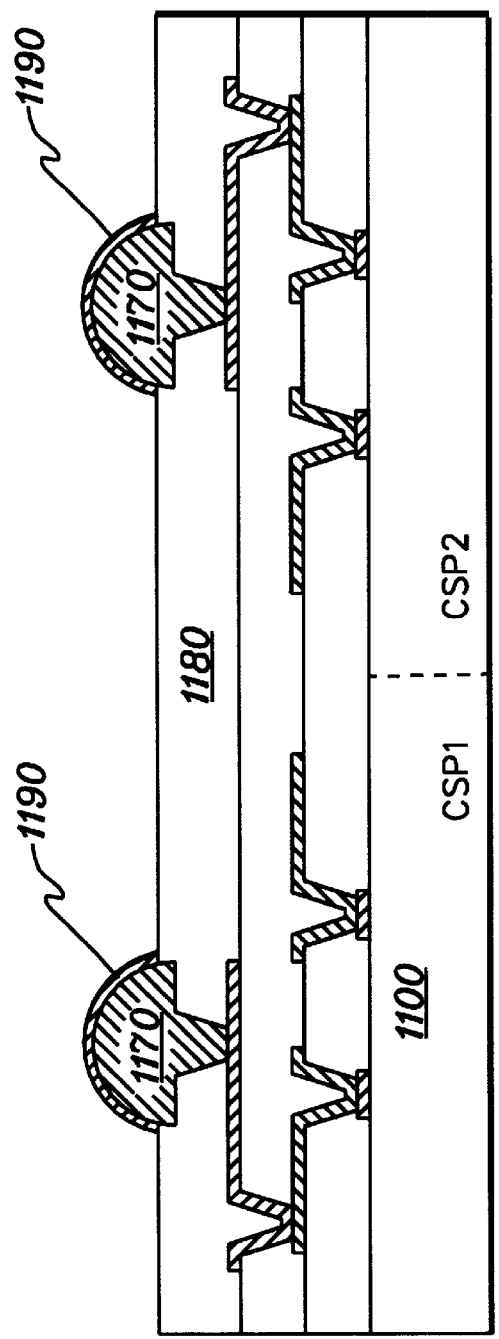
FIG. 11F is a cross-sectional elevational view of the structure of FIG. 11E after application of a self-patterning soldering mask and formation of a solderable finish on exposed portions of the conductive bumps.

To enhance and preserve solderability, an electroless layer of nickel followed by immersion gold can be applied to the exposed copper of the bumps. The copper is first etched in ammonium persulfate to remove oxide and then, e.g., the Ronamax nickel gold finishing process available from Lea Ronal of Freeport, N.Y. can be applied. FIGS. 7F & 11F show the completed panels with solder masks 780, 1180 and selectively applied solderable nickel/gold finishes 790, 1190.

Figure 8:
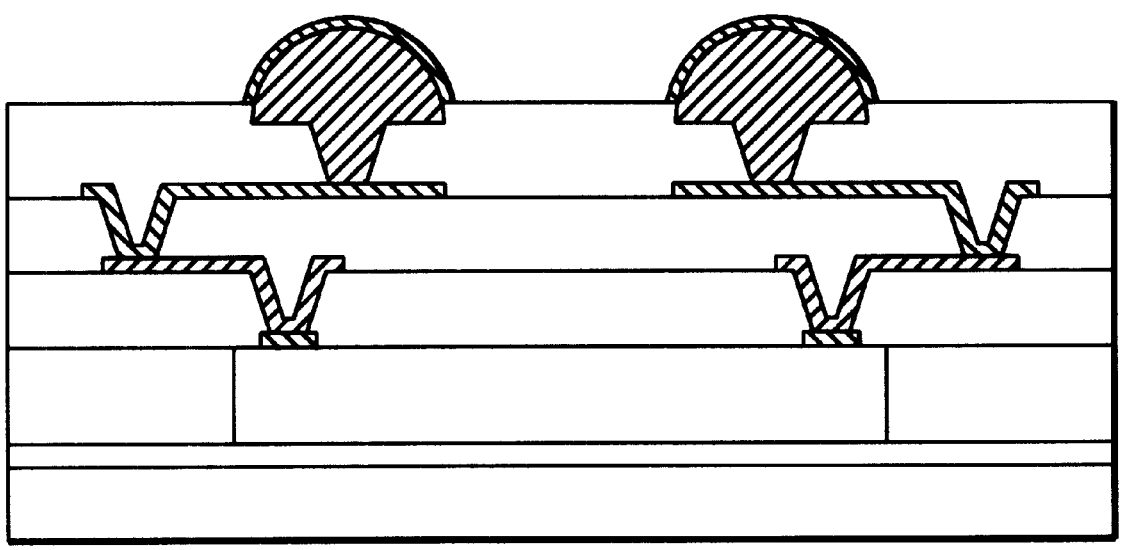
FIG. 8 is a cross-sectional elevational view of a singulated multilayer chip scale package (CSP) module obtained, for example, from the process structure of FIG.
Figure 12:
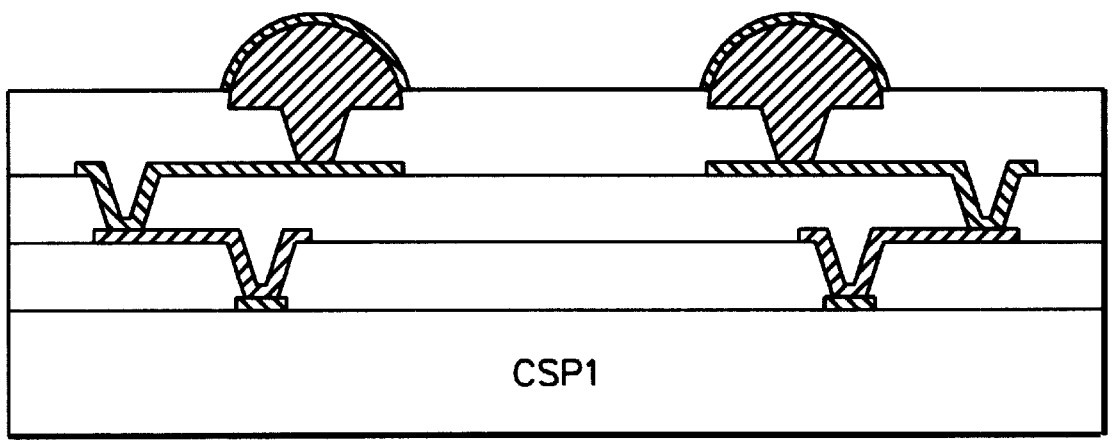
FIG. 12 is a cross-sectional elevational view of one embodiment of a singulated chip scale package (CSP) module obtained, for example, by singulating the structure of FIG. 11F in accordance with the principles of the present invention.

A CSP module is completed by sawing the panel or wafer into single modules. As noted above, the operation of dicing a panel or wafer is well known in the art. For example, singulation can be done using a Disco 320 available from Disco Corporation of Tokyo, Japan. FIG. 8 shows a multilayer chip scale package (CSP) 800 sawn from a panel. Alternatively, the multichip module of FIG. 7F could comprise the resultant structure. FIG. 12 shows a completed multilayer singulated chip scale package (CSP) 1200 module sawn from a wafer.

It is important to note some of the benefits and advantages of the structures described hereinabove. This discussion will center on the structures shown in FIGS. 8 & 7F but it is generally applicable to all the structures disclosed. The multichip module of FIG. 7F is distinguished from a Tessera structure in that the Tessera structure can not provide a multichip module, because it is fabricated on individual chips rather than on a panel of chips. In addition, the Tessera structure has no provision for via holes through its compliant layer. Contact is made to the bond pads at the edge of the chip by wire or ribbon bonding. This eliminates this area for interconnect wiring or for placement of bumps. Note that both interconnect and the I/O bumps are placed above the IC bond pads in the subject invention because via holes can be provided anywhere in the photo patternable compliant layer.

In the above description, the bump size provided (100 micron thick, 200 micron in diameter) is appropriate for mounting on a conventional printed circuit board. This is the bump size associated with a typical flip chip. Even smaller bumps can be provided however. Also note that the wiring goes directly to the IC chips and the wiring can comprise very fine lines. This shows that the subject invention has the advantages of flip chip technology, but the compliant bumps remove one of the greatest disadvantages of a flip chip, which is fatigue failure of the small bumps when attached to a non-thermal expansion matched circuit board such as an FR4 type board.

Figure 13A:
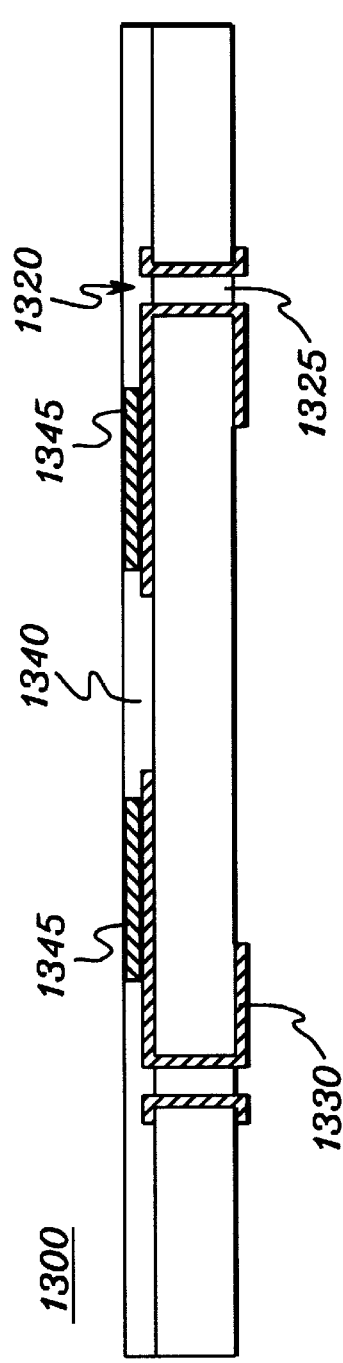
FIG. 13A is a cross-sectional elevational view of a two-sided printed circuit board with plated through holes and a solder mask and stenciled solder paste disposed thereon to which modules formed in accordance with the principles of the present invention are to be applied.
Figure 13B:
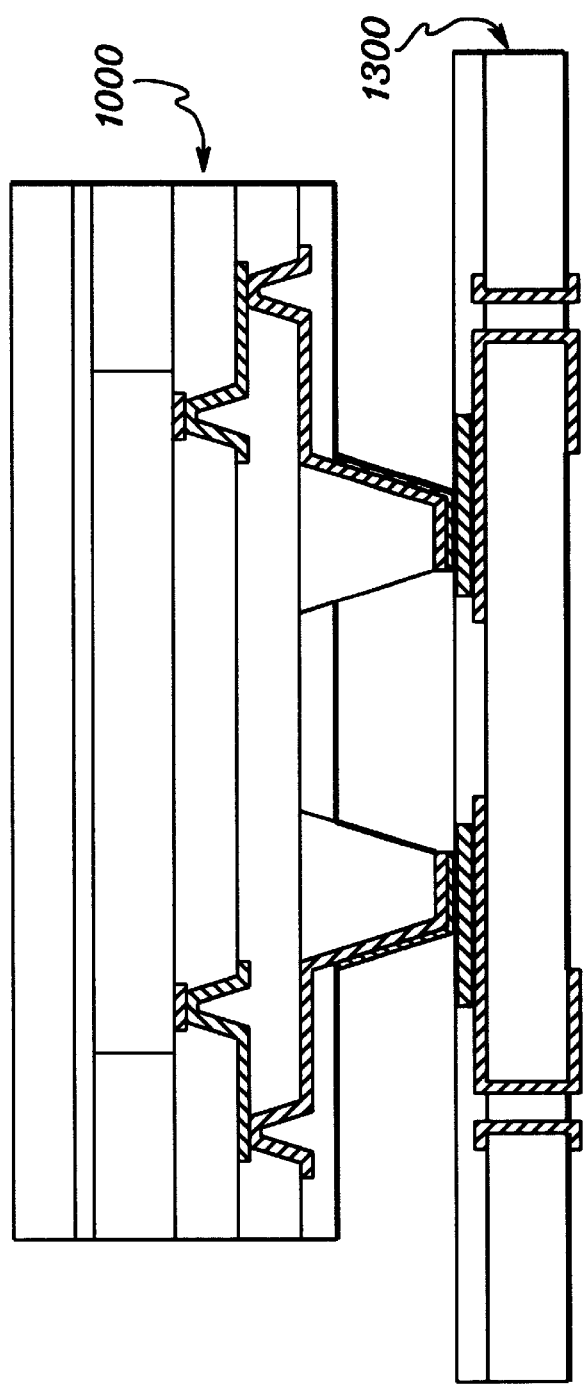
FIG. 13B is a cross-sectional elevational view of the structure of FIG. 13A and the structure of FIG. 6 shown electrically connected thereto in accordance with the principles of the present invention.
Figure 13C:
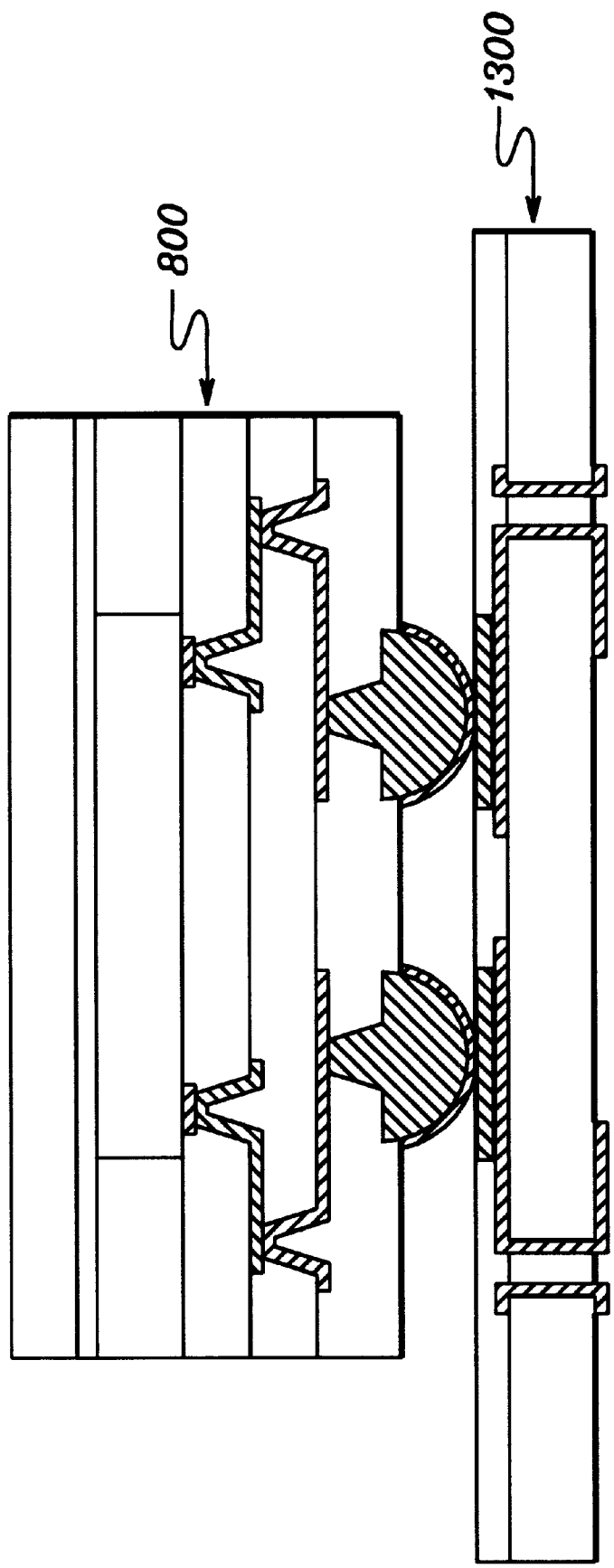
FIG. 13C is a cross-sectional elevational view of the structure of FIG. 13A and the CSP module of FIG. 8 electrically connected thereto in accordance with the principles of the present invention.
Figure 13D:
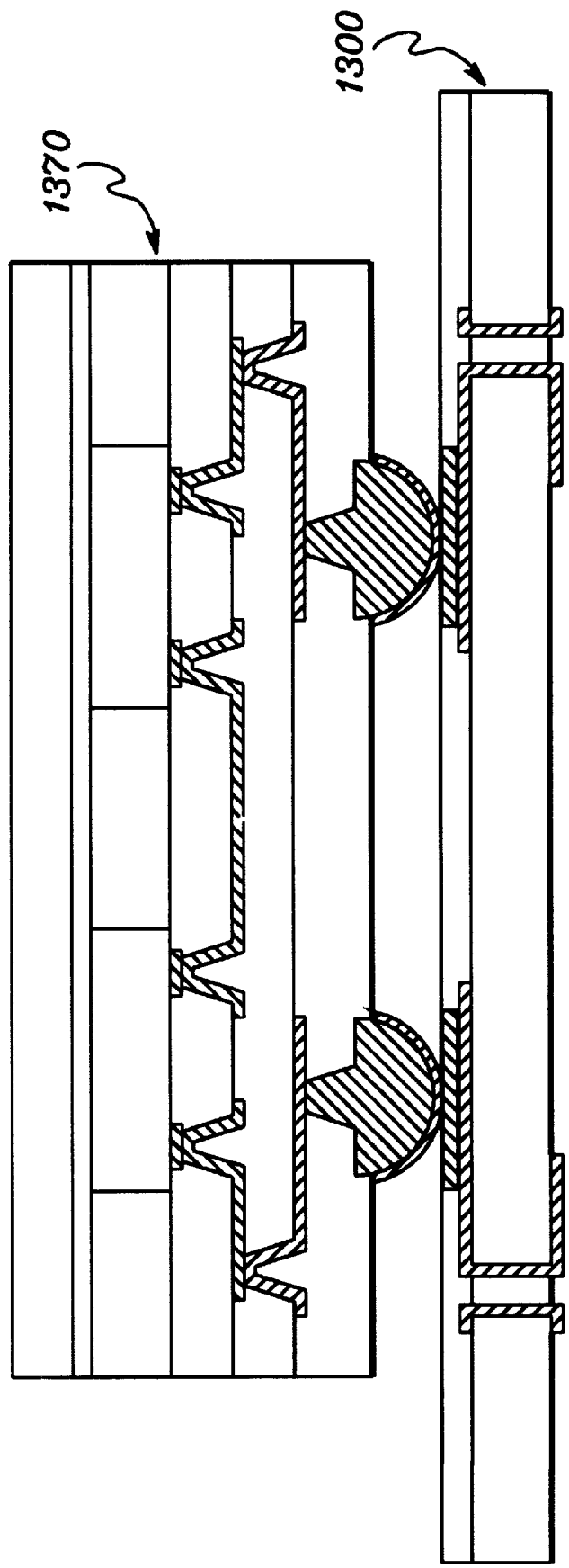
FIG. 13D is a cross-sectional elevational view of the structure of FIG. 13A showing a multichip module similar to that depicted in FIG. 7F electrically connected thereto in accordance with the principles of the present invention.

FIG. 13A shows a two sided printed circuit board 1300 with solder mask 1340 and stenciled solder paste 1345. Board 1300 includes through holes 1320 metallized with a desired conductive pattern 1330 and through holes 1325 with patterned solder mask 1340. Fabrication of this type of circuit board is well known in the art. This invention specifically relates to the provision of a bump with sufficient compliance to reduce the strain encountered when a CSP or MCM is soldered to a circuit board made of a non-expansion matched material such as an FR4 type board. FIG. 13B shows a multilayer compliant bump module 1000 (from FIG. 10) soldered to the printed circuit board 1300. FIG. 13D shows a multilayer solid bump module 800 (from FIG. 8) with compliant dielectric soldered to the printed circuit board 1300. FIG. 13E shows a single layer chip scale package (CSP) 280 sawn from a wafer and soldered to the printed circuit board 1300. Note in all cases shown, the CSP or MCM is mounted to the pads of a printed circuit board using a relatively thin layer of solder. It can be seen that if the circuit board and the module are not expansion matched there will be a resultant strain on portions of the module. In the subject invention, the strain is taken up primarily by the compliant bumps and/or the compliant dielectric layers between or beneath the bumps. This is due to the fact that the bumps and the dielectric layers have a modulus which is preferably orders of magnitude less than the modulus of the solder. The compliant dielectric has a large elongation capability, e.g., greater than 50%, which allows it to take up strains without fatigue much better than solder which fatigues after a few hundred cycles or less if the strain exceeds approximately 1%. The structures depicted in FIGS. 13B–13E are unique in that heretofore flip chip on board modules have had to be very small to limit displacement or needed underfill to try to limit the expansion of the circuit board under the chip. An assembly as shown in FIG. 13B has been tested to determine the efficacy of the structure. An array of 250 bumps on 0.5 mm centers was prepared and interconnected in a daisy chain with conductors on the test chip and a printed circuit board. Five such test chips were interconnected to the board. The board was then subjected to 1000 thermal cycles from 0C to 100C. No failures occurred. A typical flip chip of the same size would have failed before 100 cycles.

On another board a test chip was heated and removed. Flux was applied to the pads of the circuit board and another test chip placed and reflowed. Connection was obtained with no refurbishing of the solder on the pads of the circuit board.

Figure 14:
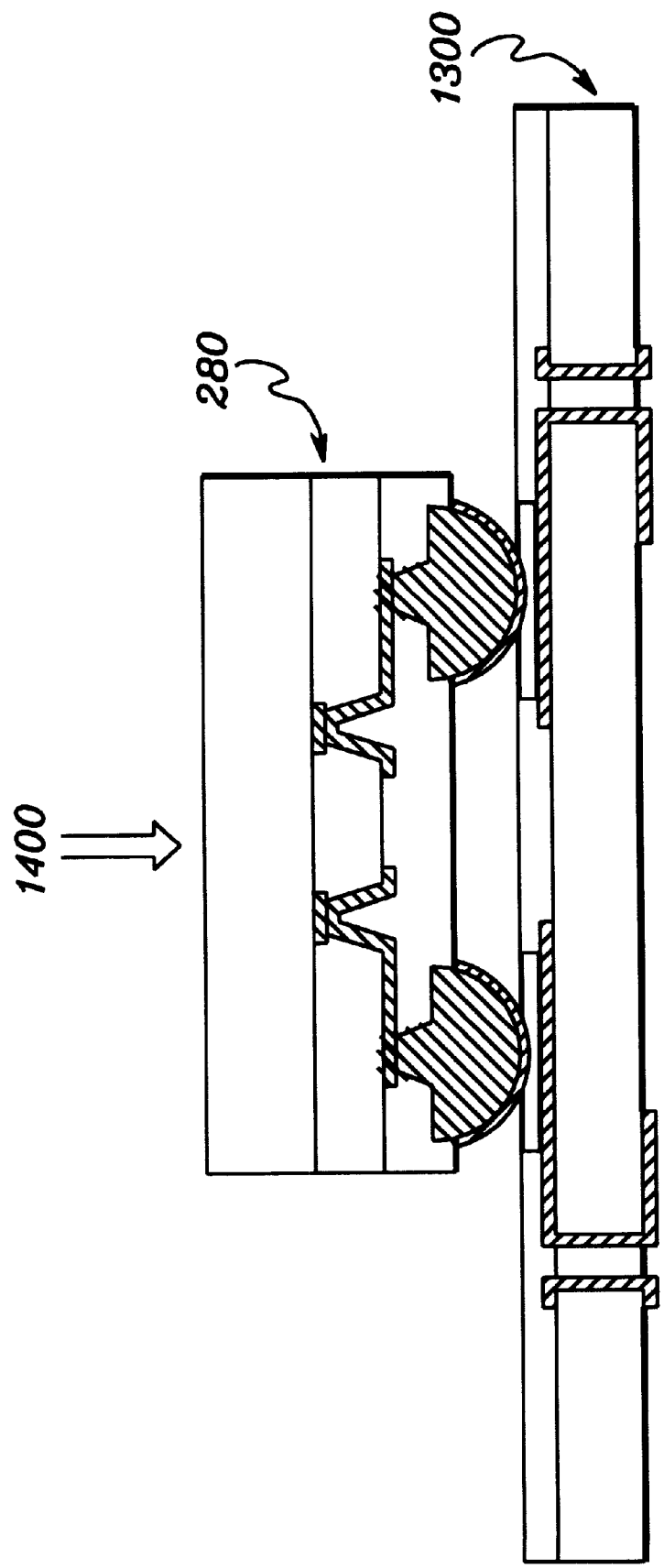
FIG. 14 is a cross-sectional elevational view of the structure of FIG. 13A wherein the CSP module of FIG. 4G being temporarily electrically connected thereto in accordance with the principles of the present invention.

Another capability of the modules fabricated as described above is that they can be temporarily connected into a circuit without the use of a socket. FIG. 14 shows a module connected to a circuit board without the use of solder. In the preferred approach the circuit board has a gold plating to reduce oxide and improve electrical connection. The compliance of the bump and/or dielectric allows any mismatch in the heights of the circuit board pads or module bumps to be absorbed. The pressure 1400 can be applied by the same spring assembly used to hold ball grid arrays in sockets. The ability to connect a module on a temporary basis without the use of solder allows for easy testing and for elimination of a costly socket. This is especially beneficial in the case of very high pin count devices with tight pad pitch. In general, sockets are several times more expensive than the package itself.

Figure 15:
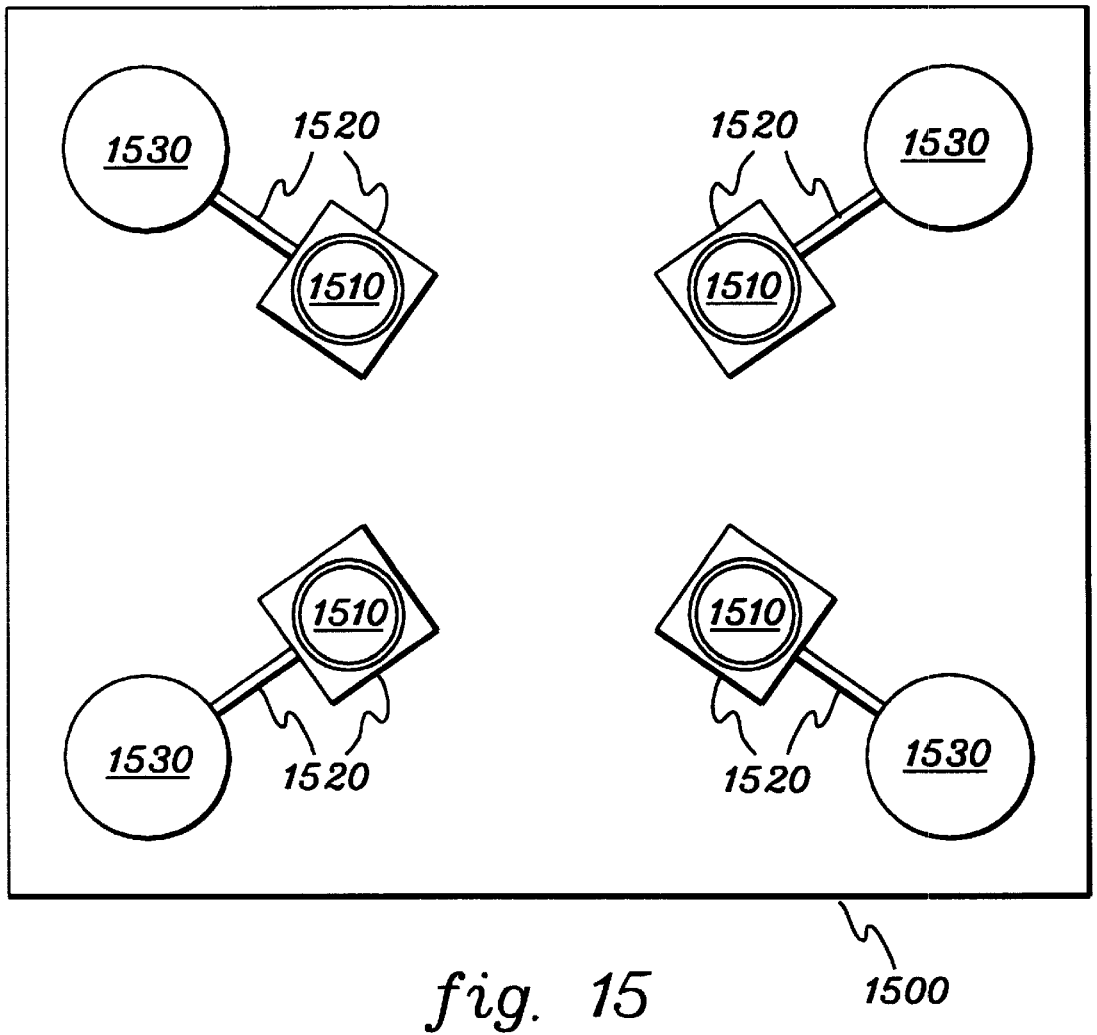
FIG. 15 depicts a planar view of bump interconnect disposition on an upper surface of a CSP or MCM module in accordance with the principles of the present invention.

In the solid metal bump structures disclosed herein, some stress is communicated to the solder on the circuit pads due to the requirement to stretch the interconnect to accommodate the thermal mismatch. To reduce this effect as much as possible, a novel structure is disclosed in FIG. 15. In this structure, the direction of the run 1520 from metallized vias 1510 which connects to the bump landing pad 1530 is always away from the center of the module. When the part is soldered in place the circuit board to which it is soldered is at its maximum expansion. As the board cools it contracts. Since the module does not contract as much, there is a net motion of the bumps which are attached to the circuit board toward the center of the module. This places the runs 1520 under compressive forces. This tends to slightly bend the run rather than actually compressing it. The bending requires less force than either stretching or compression. Since normal operating temperatures never reach solder temperature the run acts like a small spring taking up the expansion differentials by slightly bending.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A circuit structure comprising:
   a support surface having at least one contact pad disposed thereon;
   a dielectric layer disposed over said support layer, said dielectric layer having at least one via opening therein exposing said at least one contact pad;
   a metal layer disposed over said dielectric layer and extending into said at least one via opening to electrically contact said at least one contact pad; and
   at least one mushroom-shaped conductive bump disposed above said dielectric layer and electrically coupling to said metal layer, wherein each mushroom-shaped conductive bump has a stem portion and a top portion, said stem portion electrically coupling said top portion to said metal layer.

2. The circuit structure of claim 1, wherein a maximum diameter of said stem portion is less than a maximum diameter of said top portion of each said at least one mushroom-shaped conductive bump.

3. The circuit structure of claim 1, further comprising a flexible mask surrounding said at least one mushroom-shaped conductive bump.

4. The circuit structure of claim 3, wherein said flexible mask completely surrounds each stem portion of said at least one mushroom-shaped conductive bump.

5. The circuit structure of claim 4, wherein said flexible mask partially surrounds each top portion of said at least one mushroom-shaped conductive bump.

6. The circuit structure of claim 5, further comprising a nickel gold solderable finish disposed over an exposed portion of said top portion of said at least one mushroom-shaped conductive bump.

7. The circuit structure of claim 6, wherein said at least one mushroom-shaped conductive bump comprises a copper bump.

8. The circuit structure of claim 3, wherein said flexible mask comprises a low modulus material which has a high ultimate elongation property.

9. The circuit structure of claim 1, wherein said dielectric layer comprises a low modulus material (LMHE dielectric) which has a high ultimate elongation property.

10. The circuit structure of claim 9, wherein said LMHE dielectric has a Young's modulus of less than 50,000 psi.

11. The circuit structure of claim 9, wherein said LMHE dielectric has an ultimate elongation property of at least twenty percent.

12. The circuit structure of claim 9, wherein said LMHE dielectric comprises a photo patternable dielectric layer.

13. The circuit structure of claim 12, wherein said photo patternable dielectric layer is at least 25 microns thick.

14. The circuit structure of claim 1, wherein said stem portion of said at least one mushroom-shaped conductive bump electrically connects directly to said metal layer.

15. The circuit structure of claim 1, wherein said at least one contact pad comprises multiple contact pads, said at least one via opening comprises multiple via openings, and said at least one mushroom-shaped conductive bump comprises multiple mushroom-shaped conductive bumps, wherein each mushroom-shaped conductive bump is electrically coupled to an associated contact pad of said multiple contact pads through one via opening of said multiple via openings.

16. The circuit structure of claim 1, wherein said support surface comprises an upper surface of an integrated circuit chip or an upper surface of a panel comprising multiple integrated circuit chips with filler material surrounding said multiple integrated circuit chips.

17. The circuit structure of claim 1, wherein said support surface comprises one surface within one of a chip scale package (CSP) or a multichip module (MCM), and wherein said at least one mushroom-shaped conductive bump is configured to electrically couple said chip scale package or multichip module to a printed circuit board, wherein said configuration of said mushroom-shaped conductive bump facilitates absorbing stress between said CSP or MCM and said printed circuit board due to different coefficients of thermal expansion.

18. The circuit structure of claim 1, wherein said stem portion of said at least one mushroom-shaped conductive bump has a larger diameter near said top portion than near a base of said mushroom-shaped conductive bump.

19. A structure for absorbing stress between a first electrical structure and a second electrical structure, said structure comprising:
   at least one mushroom-shaped conductive bump disposed on at least one of said first electrical structure and said second electrical structure; and
   wherein said at least one mushroom-shaped conductive bump is configured as electrical interconnect between said first electrical structure and said second electrical structure and functions to accommodate stress between said first and second electrical structures resulting from said first and second electrical structures having different coefficients of thermal expansion.

20. The structure of claim 19, further comprising a dielectric layer disposed on said at least one first electrical structure or second electrical structure having said at least one mushroom-shaped conductive bump, wherein said dielectric layer comprises a low modulus material which has a high ultimate elongation property (LMHE dielectric).

21. The structure of claim 20, wherein said dielectric layer comprises a flexible mask surrounding each said at least one mushroom-shaped conductive bump.

22. The structure of claim 20, wherein said LMHE dielectric has a Young's modulus of less than 50,000 psi.

23. The structure of claim 20, wherein said LMHE dielectric has an ultimate elongation property of at least twenty percent.

24. The structure of claim 20, wherein said flexible mask completely surrounds a stem portion of each said at least one mushroom-shaped conductive bump.

* * * * *